US012684759B2

(12) United States Patent
Lee et al.

(10) Patent No.: US 12,684,759 B2
(45) Date of Patent: Jul. 14, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Hoin Lee, Suwon-si (KR); Byung-Hyun Lee, Suwon-si (KR); Hoouk Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 430 days.

(21) Appl. No.: 18/350,427

(22) Filed: Jul. 11, 2023

(65) Prior Publication Data

US 2024/0237331 A1 Jul. 11, 2024

(30) Foreign Application Priority Data

Jan. 9, 2023 (KR) ........................ 10-2023-0002904

(51) Int. Cl.
*H10B 12/00* (2023.01)
*H10D 64/27* (2025.01)

(52) U.S. Cl.
CPC ........... *H10B 12/315* (2023.02); *H10B 12/03* (2023.02); *H10B 12/482* (2023.02); *H10D 64/512* (2025.01)

(58) Field of Classification Search
CPC .... H10B 12/315; H10B 12/03; H10B 12/482; H10B 12/37; H10B 12/09; H10B 12/48; H10B 12/50; H10D 64/512
See application file for complete search history.

(56) References Cited

U.S. PATENT DOCUMENTS

| | | | | |
|---|---|---|---|---|
| 10,658,173 | B2 | 5/2020 | Chang et al. | |
| 2009/0121268 | A1* | 5/2009 | Lee ...................... | H10B 12/482 |
| | | | | 257/329 |
| 2014/0131786 | A1* | 5/2014 | Ryu ..................... | H10B 12/053 |
| | | | | 257/316 |
| 2017/0084710 | A1* | 3/2017 | Koh ..................... | H10B 12/053 |
| 2017/0323893 | A1* | 11/2017 | Kim ..................... | H10B 12/34 |

(Continued)

FOREIGN PATENT DOCUMENTS

| | | |
|---|---|---|
| KR | 2003-0077366 A | 10/2003 |
| KR | 10-2006-0074990 A | 7/2006 |
| KR | 10-0753417 B1 | 8/2007 |

(Continued)

*Primary Examiner* — Yasser A Abdelaziez

(74) *Attorney, Agent, or Firm* — Harness, Dickey & Pierce P.L.C

(57) ABSTRACT

A semiconductor device includes a substrate including a cell array region and a core region disposed around the cell array region; a plurality of storage element contacts; a contact plug; and a contact plug spacer. The plurality of storage element contacts may include a first storage element contact and at least one second storage element contact, the first storage element contact is a closest storage element contact of the plurality of storage element contacts to the core region, such that the first storage element contact is between the core region and the at least one second storage element contact. A step difference in a vertical direction perpendicular to the substrate between a top surface of the first storage element contact and a top surface of the at least one second storage element contact is 5 nm or less.

7 Claims, 30 Drawing Sheets

(56)            References Cited

U.S. PATENT DOCUMENTS

2020/0373306 A1      11/2020   Kim et al.
2021/0242215 A1*     8/2021    Park ................. H01L 21/76829

FOREIGN PATENT DOCUMENTS

KR             10-1010467  B1      1/2011
KR        10-2017-0028666  A       3/2017
KR             10-2323253  B1     11/2021

* cited by examiner

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2023-0002904 filed in the Korean Intellectual Property Office on Jan. 9, 2023, the entire contents of which are incorporated herein by reference.

BACKGROUND

1. Field

The present inventive concepts relate to semiconductor devices and methods of manufacturing the same.

2. Description of the Related Art

As semiconductor devices become increasingly highly integrated, individual circuit patterns are becoming more miniaturized in order to implement more cell devices in the same area. That is, as the degree of integration of semiconductor devices increases, design rules for components of semiconductor devices decrease.

Processes of forming components of highly scaled semiconductor devices are becoming increasingly complex and difficult.

SUMMARY

One of the technical objects to be achieved by the technical idea of the present inventive concepts is to provide a semiconductor device that implements more cell elements in the same area and secures a sufficient separation distance between components of a highly scaled semiconductor device.

One of the technical objects to be achieved by the technical idea of the present inventive concepts is to provide a method of manufacturing a semiconductor device that implements more cell elements in the same area and secures a sufficient separation distance between components of a highly scaled semiconductor device.

A semiconductor device according to some example embodiments to obtain these technical objects may include a substrate including a cell array region and a core region; a plurality of storage element contacts in the cell array region; a contact plug in the core region; and a contact plug spacer on a sidewall of the contact plug. The plurality of storage element contacts may include a first storage element contact and at least one second storage element contact, the first storage element contact is a closest storage element contact of the plurality of storage element contacts to the core region in a direction parallel to the substrate, such that the first storage element contact is between the core region and the at least one second storage element contact. A step difference in a vertical direction perpendicular to the substrate between a top surface of the first storage element contact and a top surface of the at least one second storage element contact may be 5 nm or less.

In some example embodiments, a semiconductor device may include: a substrate including a cell array region and a core region; a plurality of cell gate electrodes in the cell array region; a plurality of cell conductive lines in the cell array region; a plurality of storage element contacts in the cell array region; a plurality of core gate structures in the core region; a contact plug in the core region; and a contact plug spacer on a sidewall of the contact plug. The plurality of storage element contacts may include a first storage element contact and at least one second storage element contact, the first storage element contact is a closest storage element contact of the plurality of storage element contacts to the core region in a direction parallel to the substrate, such that the first storage element contact is between the core region and the at least one second storage element contact. A step difference in a vertical direction perpendicular to the substrate between a top surface of the first storage element contact and a top surface of the at least one second storage element contact may be 5 nm or less.

In some example embodiments, a method of manufacturing a semiconductor device according to some example embodiments may include forming a first insulating layer in a cell array region of a substrate including the cell array region and a core region; etching the first insulating layer to form a plurality of storage element contact holes; filling at least a portion of the plurality of storage element contact holes, forming a dummy mold layer over the core region and the cell array region, and planarizing the dummy mold layer to expose a top surface of the first insulating layer and form a dummy mold pattern in the plurality of storage element contact holes; forming a contact plug hole in the core region; and forming a contact plug spacer on an inner wall of the contact plug hole.

In the semiconductor device according to some example embodiments, a top surface of a storage element contact near a core region, which has been discarded as a dummy cell in the related art, has a very small step difference with a top surface of a storage element contact of an effective cell, so that many cells may be included in the same area by reducing the number of dummy cells. Further, the semiconductor device according to some example embodiments may secure a sufficient separation distance between highly scaled components by selectively forming a thick spacer in a contact plug of a core region without affecting a cell array region.

BRIEF DESCRIPTION OF THE DRAWINGS

FIGS. 10, 11, 12, 13, 14, 15, 16, 17, 18, 19, 20, and 21 are cross-sectional views illustrating a method of manufacturing a semiconductor device according to some example embodiments.

DETAILED DESCRIPTION

Figure 1:
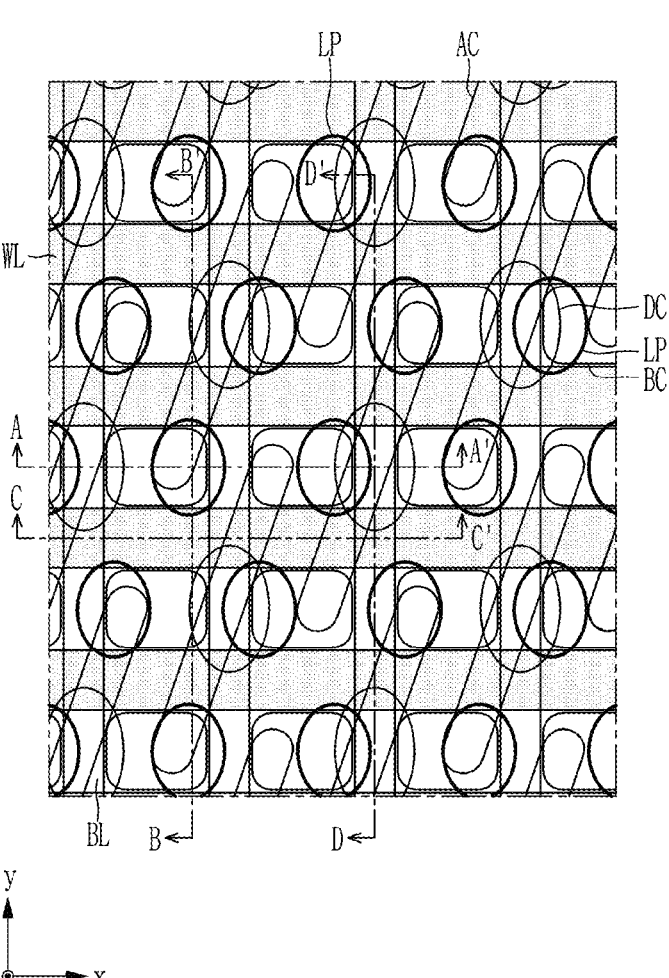
FIG. 1 is a top plan view schematically illustrating a cell array region of a semiconductor device according to some example embodiments.

In the following detailed description, only some example embodiments of the present inventive concepts have been illustrated and described, simply by way of illustration. As those skilled in the art would realize, the described example embodiments may be modified in various different ways, all without departing from the spirit or scope of the present inventive concepts.

Accordingly, the drawings and description are to be regarded as illustrative in nature and not restrictive. Like reference numerals designate like elements throughout the specification.

In addition, expressions described in the singular may be interpreted in the singular or plural unless explicit expressions such as "one" or "single" are used. Terms including an ordinary number, such as first and second, are used for describing various components, and are not to be interpreted as limiting these components. These terms may be used for the purpose of distinguishing one constituent element from other constituent elements.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Hereinafter, some example embodiments of the present inventive concepts will be described in detail with reference to the accompanying drawings. A Dynamic Random Access Memory (DRAM) is illustratively illustrated in the drawings of the semiconductor device according to some example embodiments, but is not limited thereto.

A semiconductor device according to some example embodiments may include a cell array region CA and a core region CORE. The core region CORE may be disposed around the cell array region CA. A core region CORE that is disposed around the cell array region CA may be adjacent (e.g., directly or indirectly adjacent) to the cell array region CA, may at least partially surround the cell array region and/or may at least partially overlap the cell array region CA in a direction extending horizontal (e.g., parallel) to the substrate, or the like.

FIG. 1 is a top plan view illustrating a portion of a configuration of a cell array region CA of a semiconductor device according to some example embodiments.

Referring to FIG. 1, the cell array region CA may include a plurality of active regions AC. The active region AC may be defined by an element isolation pattern (14A in FIG. 2) disposed in a substrate 10 (see FIG. 2). As illustrated, the active region AC may be disposed in a bar shape of a diagonal line or an oblique line according to a reduction in design rules of the semiconductor device.

A plurality of gate electrodes may be disposed in a first direction (x direction) across the active region AC. A plurality of gate electrodes may extend parallel to each other. The plurality of gate electrodes may be, for example, a plurality of word lines (WL). The word lines WL may be arranged at regular intervals. The width of the word lines WL or the interval between the word lines WL may be determined according to design rules.

Each active region AC may be divided into three parts by the two word lines WL extending in the first direction (x direction). The active region AC may include a storage element connection region and a bit line connection region. The bit line connection region may be positioned in the middle of the active region AC, and the storage element connection region may be positioned at an end of the active region AC.

A plurality of bit lines BL extending in a second direction (y direction) orthogonal to the word line WL may be disposed on the word line WL. The plurality of bit lines BL may extend parallel to each other. The bit lines BL may be arranged at regular intervals. The width of the bit lines BL or the interval between the bit lines BL may be determined according to design rules.

A semiconductor device according to some example embodiments may include various contact arrays disposed on the active region AC. Various contact arrays may include, for example, direct contacts DC and storage element contacts BC.

Here, the direct contact DC may refer to a contact electrically connecting the active region AC to the bit line BL. The storage element contact BC may refer to a contact connecting the active region AC to the lower electrode of the capacitor. Due to the disposition structure, a contact area between the storage element contact BC and the active region AC may be small. Accordingly, in order to increase the contact area with the active region AC and the contact area with the lower electrode of the capacitor, a conductive landing pad LP may be introduced.

The landing pad LP may be disposed between the active region AC and the storage element contact BC, or may also be disposed between the storage element contact BC and the lower electrode of the capacitor. In some example embodiments, the landing pad LP may be disposed between the storage element contact BC and the lower electrode of the capacitor. Contact resistance between the active region AC and the lower electrode of the capacitor may be reduced by increasing the contact area through introduction of the landing pad LP.

The direct contact DC may be connected to the bit line connection region. The storage element contact BC may be connected to the storage element connection region. As the storage element contact BC is disposed at both ends of the active region AC, the landing pad LP may be disposed adjacent to both ends of the active region AC and partially overlaps the storage element contact BC. In other words, the storage element contact BC may be disposed to overlap (e.g., in a vertical direction extending perpendicular to the substrate 10, such as the z direction) the active region AC and the element isolation pattern 14A between adjacent word lines WL and between adjacent bit lines BL. The plurality of storage element contacts BC may be disposed while being spaced apart from each other in the first direction (x direction) and the second direction (y direction), which may each be understood to be a horizontal direction extending parallel to the substrate 10, where the first and second directions may be different from each other (e.g., perpendicular to each other).

In some example embodiments, the word line WL may be formed in a structure buried in the substrate 10. The word line WL may be disposed across the active region AC between the direct contacts DC or the storage element contacts BC. As illustrated, two word lines WL may be disposed to cross one active region AC. As the active region AC extends in an oblique direction between the first direction (x direction) and the second direction (y direction), the word line WL may have an angle of less than 90° with the active region AC.

The direct contacts DC and the storage element contacts BC may be symmetrically arranged. As a result, each of the direct contact DC and the storage element contact BC may be disposed on a straight line along the first direction (x direction) and the second direction (y direction). Meanwhile, unlike the direct contact DC and the storage element contact BC, the landing pad LP may be arranged in a zigzag shape in the second direction (y direction) in which the bit line BL extends. Also, the landing pad LP may be disposed to overlap the same lateral portion of each bit line BL in the first direction (x direction) in which the word line WL extends. For example, each of the landing pads LP of the first line may overlap the left side of the corresponding bit line BL, and each of the landing pads LP of the second line may overlap the right side of the corresponding bit line BL.

Figure 2:
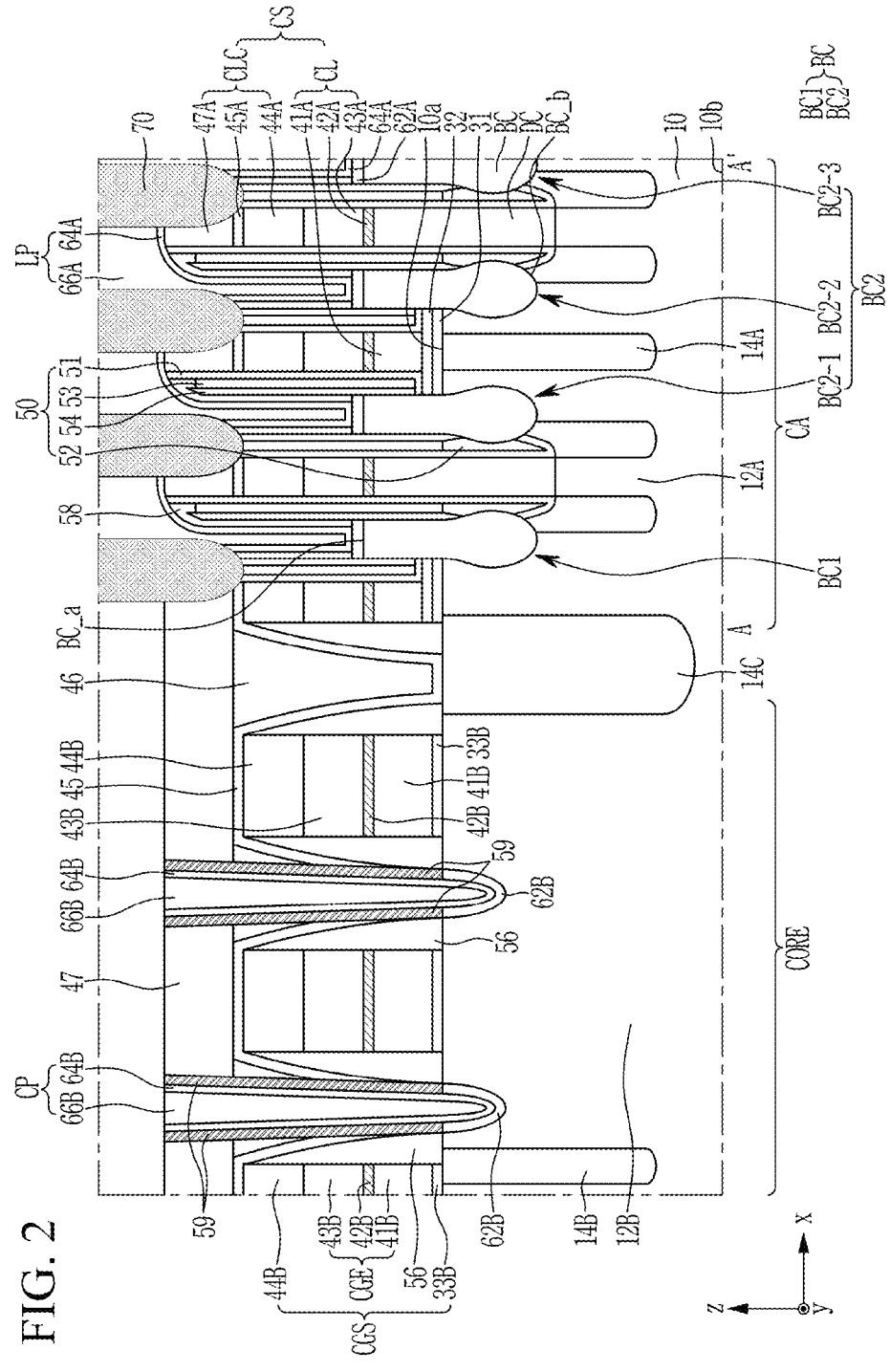
FIGS. 2, 3, 4, and 5 are cross-sectional views taken along lines A-A', B-B', C-C', and D-D' of FIG. 1, respectively.
Figure 3:
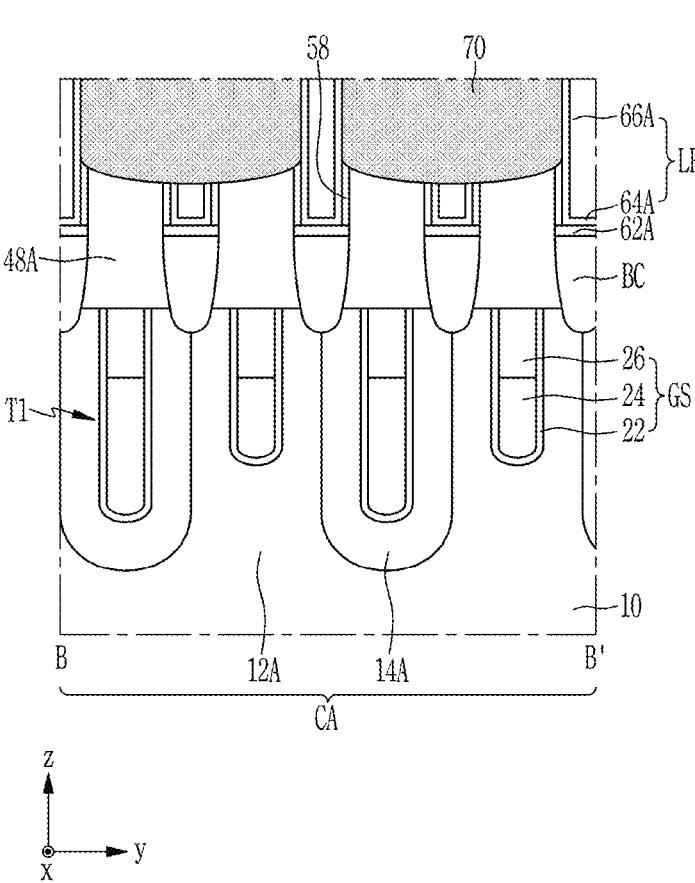
Figure 4:
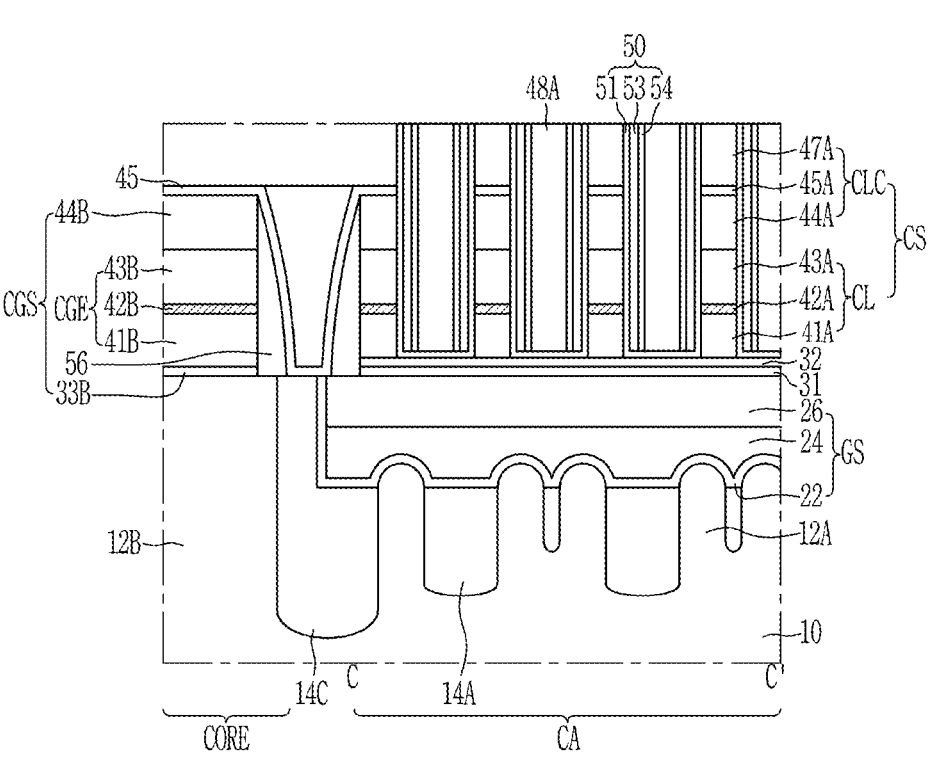
Figure 4:
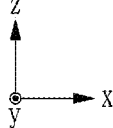
Figure 5:
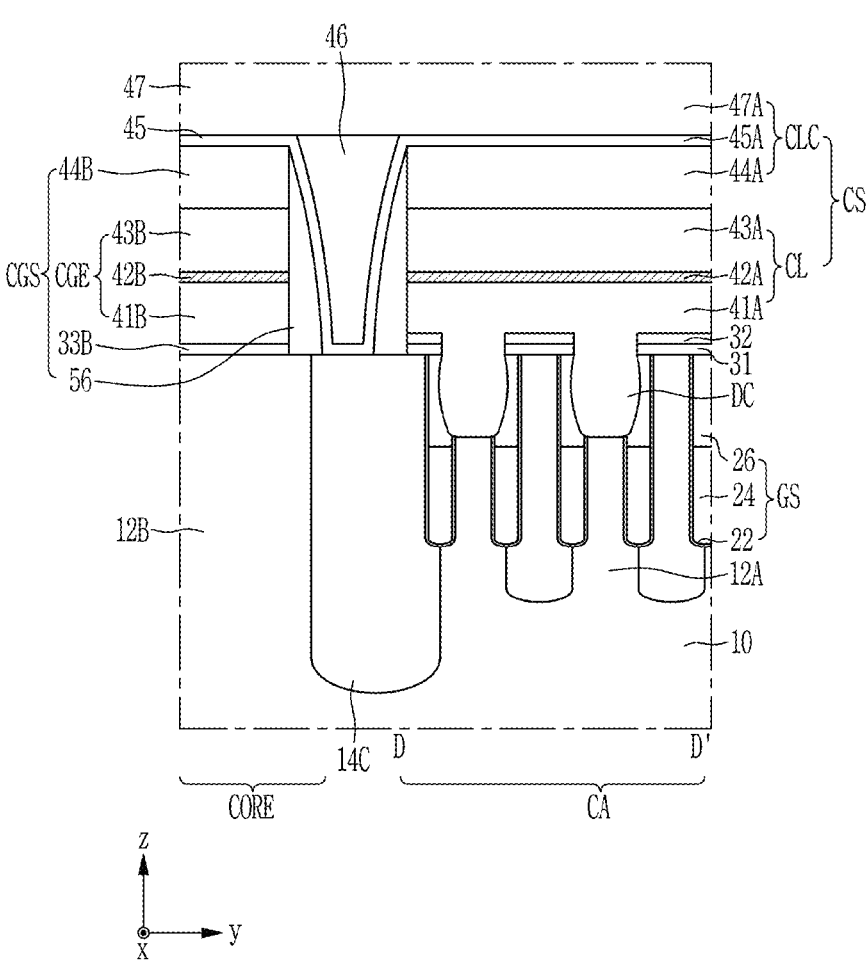

FIGS. 2, 3, 4, and 5 are cross-sectional views taken along lines A-A', B-B', C-C', and D-D' of FIG. 1, respectively, according to some example embodiments. In FIGS. 2, 4, and 5, the cross-sections of the cell array region CA and the core region CORE disposed around the cell array region CA (e.g., indirectly adjacent to the cell array region CA in the direction parallel to the substrate 10) are illustrated together.

Referring to FIGS. 2 to 5, the substrate 10 may include the cell array region CA and the core region CORE separated (e.g., at least partially isolated from direct contact with each other) by the cell region isolation pattern 14C. As shown, the cell array region CA and the core region CORE may be indirectly adjacent to each other, separated from each other by the cell region isolation pattern 14C, but example embodiments are not limited thereto. The cell array region CA and the core region CORE may include active regions 12A and 12B defined by the element isolation patterns 14A and 14B, respectively. That is, the element isolation patterns 14A and 14B may be disposed around the active regions 12A and 12B (e.g., adjacent to the active regions 12A and 12B, respectively) to define the active regions 12A and 12B.

The substrate 10 may be a silicon substrate or a Silicon-On-Insulator (SOI). Alternatively, the substrate 10 may include silicon germanium, silicon germanium on insulator (SGOI), indium antimonide, lead tellurium compound, indium arsenide, indium phosphide, gallium arsenide, or gallium antimonide, but is not limited thereto.

The element isolation patterns 14A and 14B and the cell region isolation pattern 14C may have a Shallow Trench Isolation (STI) structure having excellent element isolation characteristics.

The plurality of active regions 12A in the cell array region CA may have a relatively long island shape having a short axis and a long axis, respectively, like the active region AC illustrated in FIG. 1.

The element isolation patterns 14A and 14B and the cell region isolation pattern 14C may include silicon oxide, silicon nitride, silicon oxynitride, or a combination thereof, but are not limited thereto. In FIGS. 2 to 5, the element isolation patterns 14A and 14B and the cell region isolation pattern 14C are illustrated as being formed as a single layer, but this is only for convenience of description and the present inventive concepts are not limited thereto. Each of the element isolation patterns 14A and 14B and the cell region isolation pattern 14C may be formed of a single insulating layer or a plurality of insulating layers, depending on its width.

In FIGS. 2 to 5, top surfaces of the element isolation patterns 14A and 14B and the cell region isolation pattern 14C are illustrated to be on the same level as the top surface of the substrate 10, but this is only for convenience of description, and the present inventive concepts are not limited thereto.

The semiconductor device according to some example embodiments may include a word line having a buried structure.

Referring to FIGS. 3 and 4, in some example embodiments, the cell gate structure GS may be disposed in the active region 12A and the element isolation pattern 14A. The cell gate structure GS may be disposed across the element isolation pattern 14A and the active region 12A defined by the element isolation pattern 14A. The cell gate structure GS may include a cell gate insulating layer 22, a cell gate electrode 24, and a cell gate capping pattern 26. Here, the cell gate electrode 24 may correspond to the word line WL.

In some example embodiments, the cell gate structure GS may further include a cell gate capping conductive layer (not illustrated).

Referring to FIG. 3, the cell gate insulating layer 22 may extend along sidewalls and a bottom surface of a cell gate trench T1. The cell gate insulating layer 22 may extend along the profile of at least a portion of the cell gate trench T1. The cell gate insulating layer 22 may include, for example, at least one of silicon oxide, silicon nitride, silicon oxynitride, or a high dielectric constant material having a higher dielectric constant than silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The cell gate electrode 24 may be disposed on the cell gate insulating layer 22. The cell gate electrode 24 may fill a portion of the cell gate trench T1. According to some example embodiments, when a cell gate capping conductive layer (not illustrated) is included, the cell gate capping conductive layer may extend along a top surface of the cell gate electrode 24.

The cell gate electrode 24 may include, for example, at least one of a metal, a metal alloy, a conductive metal nitride, a conductive metal carbo nitride, a conductive metal carbide, a metal silicide, a doped semiconductor material, a conductive metal oxynitride, or conductive metal oxide. The cell gate electrode 24 may be, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuO$_x$, or combinations thereof. The cell gate capping conductive layer (not illustrated) may include, for example, poly-silicon or poly-silicon-germanium.

The cell gate capping pattern 26 may be disposed on the cell gate electrode 24 or the cell gate capping conductive layer (not illustrated). The cell gate capping pattern 26 may fill the cell gate trench T1 remaining after the cell gate electrode 24 is formed. The cell gate insulating layer 22 is illustrated as extending along the sidewall of the cell gate capping pattern 26, but is not limited thereto. The cell gate capping pattern 26 may include, for example, at least one of silicon nitride (SiN), silicon oxynitride (SiON), silicon oxide (SiO$_2$), silicon carbonitride (SiCN), silicon oxycarbonitride (SiOCN), or combinations thereof.

Although not illustrated, an impurity doped region may be disposed on at least one side of the cell gate structure GS. The impurity doped region may be a source/drain region of the transistor.

A cell conductive line CL and a cell line capping layer CLC disposed on the cell conductive line CL may be disposed in the cell array region CA. The cell conductive line CL and the cell line capping layer CLC may be referred to as a cell line structure CS. In some example embodiments, the cell conductive line CL may be disposed on the active region 12A and the element isolation pattern 14A where the cell gate structure GS is disposed. The cell conductive line CL may cross the element isolation pattern 14A and the active region AC (12A) defined by the element isolation pattern 14A. The cell conductive line CL may be disposed to cross the cell gate structure GS. Here, the cell conductive line CL may correspond to the bit line BL.

The cell conductive line CL may be multi-layered. The cell conductive line CL may include, for example, a first conductive pattern 41A, a second conductive pattern 42A, and a third conductive pattern 43A. The first to third conductive patterns 41A, 42A, and 43A may be sequentially stacked on the active region 12A and the element isolation pattern 14A. Although the cell conductive line CL is illustrated as having a triple layer, the cell conductive line CL is not limited thereto.

Each of the first to third conductive patterns 41A, 42A, and 43A may include, for example, at least one of a semiconductor material doped with impurities, a conductive silicide compound, a conductive metal nitride, a metal, or a metal alloy. For example, the first conductive pattern 41A may include a doped semiconductor material (for example, doped polysilicon), the second conductive pattern 42A may include at least one of a conductive silicide compound or a conductive metal nitride, and the third conductive pattern 43A may include at least one of a metal or a metal alloy, but the present inventive concepts are not limited thereto.

The direct contact DC may electrically connect the cell conductive line CL and the substrate 10. The direct contact DC may be disposed at a point where the cell conductive line CL crosses a central portion of the active region AC having a long island shape. The direct contact DC may be disposed on the bit line connection region of the active region AC.

Referring to FIG. 2, the direct contact DC may be disposed at a point where the cell conductive line CL and the active region 12A of the substrate 10 intersect. That is, the cell conductive line CL may be disposed on the direct contact DC. Accordingly, the cell conductive line CL may include the second and third conductive patterns 42A and 43A in a region overlapping the top surface of the direct contact DC. The cell conductive line CL may include the first to third conductive patterns 41A, 42A, and 43A in a region that does not overlap the top surface of the direct contact DC.

The cell line capping layer CLC may be disposed on the cell conductive line CL. The cell line capping layer CLC may extend in the second direction (y direction) along the top surface of the cell conductive line CL.

The cell line capping layer CLC may include, for example, at least one of silicon nitride, silicon oxynitride, silicon carbonitride, or silicon oxycarbonitride.

As illustrated, the cell line capping layer CLC may have a triple layer structure. For example, the cell line capping layer CLC may include a cell line capping pattern 44A, a cell line insulating pattern 45A, and a first mask pattern 47A.

The cell line capping pattern 44A, the cell line insulating pattern 45A, and the first mask pattern 47A may include, for example, at least one of silicon nitride, silicon oxynitride, silicon carbonitride, and silicon oxycarbonitride.

In FIGS. 2 to 5, the cell line capping layer CLC is illustrated as being a triple layer, but is not limited thereto. Unlike some example embodiments, including the example embodiments shown in FIGS. 2 to 5, the cell line capping layer CLC may have a structure of a single layer, a double layer, or a quadruple layer or more.

A cell insulating film may be disposed on the active region 12A and the element isolation pattern 14A. More specifically, the cell insulating film may be disposed on the active region 12A, the element isolation pattern 14A and the cell region isolation pattern 14C where the direct contact DC and the storage element contact BC are not disposed. The cell insulating film may be disposed between the active region 12A and the cell conductive line CL, and between the element isolation pattern 14A and the cell conductive line CL.

The cell insulating film may be a single film, but as illustrated, the cell insulating film may be a multi-film including a first insulating film 31 and a second insulating film 32. For example, the first insulating film 31 may include a silicon oxide film, and the second insulating film 32 may include a silicon nitride film, but the present inventive concepts are not limited thereto. Unlike some example embodiments, including the example embodiments shown in FIGS. 2 to 5, the cell insulating film may be a triple film including a silicon oxide film, a silicon nitride film, and a silicon oxide film, but is not limited thereto.

A cell line spacer 50 may be disposed on sidewalls of the cell line structure CS and the direct contact DC. The cell line spacer 50 disposed on the sidewall of the direct contact DC may be disposed on the active region 12A and the element isolation pattern 14A. The cell line spacer 50 disposed on the sidewall of the cell line structure CS may be disposed on the first and second insulating films 31 and 32.

The cell line spacer 50 may be formed of one type of spacer or a plurality of spacers of two or more types. In some example embodiments, the cell line spacer 50 may be formed of a plurality of spacers. The plurality of spacers may include, for example, at least one of silicon oxide, silicon nitride, silicon oxynitride (SiON), silicon oxycarbonitride (SiOCN), air, or combinations thereof, but is not limited thereto.

Referring to FIG. 2, in some example embodiments, the cell line spacer 50 may include first to fourth spacers 51, 52, 53, and 54. The first spacer 51 may cover both sidewalls of the cell line structure CS, an inner wall of a direct contact hole DCH (see FIG. 12), and a top surface of the second insulating film 32. The second spacer 52 may fill the direct contact hole DCH (see FIG. 12) that is not filled by the first spacer 51. The third spacer 53 may be disposed to cover the sidewalls of the first spacers 51 disposed on both sidewalls of the cell line structure CS. The fourth spacer 54 may be disposed to cover sidewalls of the third spacers 53 disposed on both sidewalls of the cell line structure CS. The third and fourth spacers 53 and 54 may not fill the direct contact hole DCH (see FIG. 12). The first, second, and fourth spacers 51, 52, and 54 may include silicon nitride, and the third spacer 53 may include silicon oxide or air, but the present inventive concepts are not limited thereto.

Referring to FIG. 3, a fence 48A may be disposed on the active region 12A and the element isolation pattern 14A. In some example embodiments, the fence 48A may be disposed to overlap the cell gate structure GS disposed in the active region 12A and the element isolation pattern 14A. The fence 48A may be disposed between the cell line structures CS (e.g., between adjacent cell line structures CS) extending in the second direction (y direction). The fence 48A may include, for example, at least one of silicon oxide, silicon nitride, silicon oxynitride, or combinations thereof, but is not limited thereto.

The storage element contact BC (e.g., at least one storage element contact BC, each storage element contact BC, or the like) may be a buried contact formed in a form in which at least a portion thereof is buried in the substrate 10. That is, the bottom surface BC_b of the storage element contact BC may be lower (e.g., closer to a bottom surface 10b of the substrate 10 in the z direction) than the top surface 10a of the substrate 10. As illustrated in FIG. 2, the top surface BC_a of the storage element contact BC may be higher (e.g., further from a bottom surface 10b of the substrate 10 in the z direction) than the top surface 10a of the substrate 10, but the present inventive concepts are not limited thereto.

The storage element contact BC may be disposed between the cell conductive lines CL adjacent in the first direction (x direction). The storage element contact BC may be disposed between the fences 48A adjacent in the second direction (y direction). The storage element contact BC may overlap the active region 12A and the element isolation pattern 14A between adjacent cell conductive lines CL. The storage element contact BC may be connected to the storage element connection region of the active region AC.

The storage element contact BC may include, for example, at least one of a semiconductor material doped with impurities, a conductive silicide compound, a conductive metal nitride, or a metal. The storage element contact BC may be, for example, a semiconductor material doped with impurities, and may include doped polysilicon. The storage element contact BC may include, for example, polysilicon doped with phosphorus, arsenic, boron, or a combination thereof.

According to some example embodiments according to the technical concept of the present inventive concepts, a characteristic of a very small step difference between top surfaces of the plurality of storage element contacts BC may be exhibited. This characteristic may be attributed to advantages in the manufacturing process of a semiconductor device described later.

Figure 17:
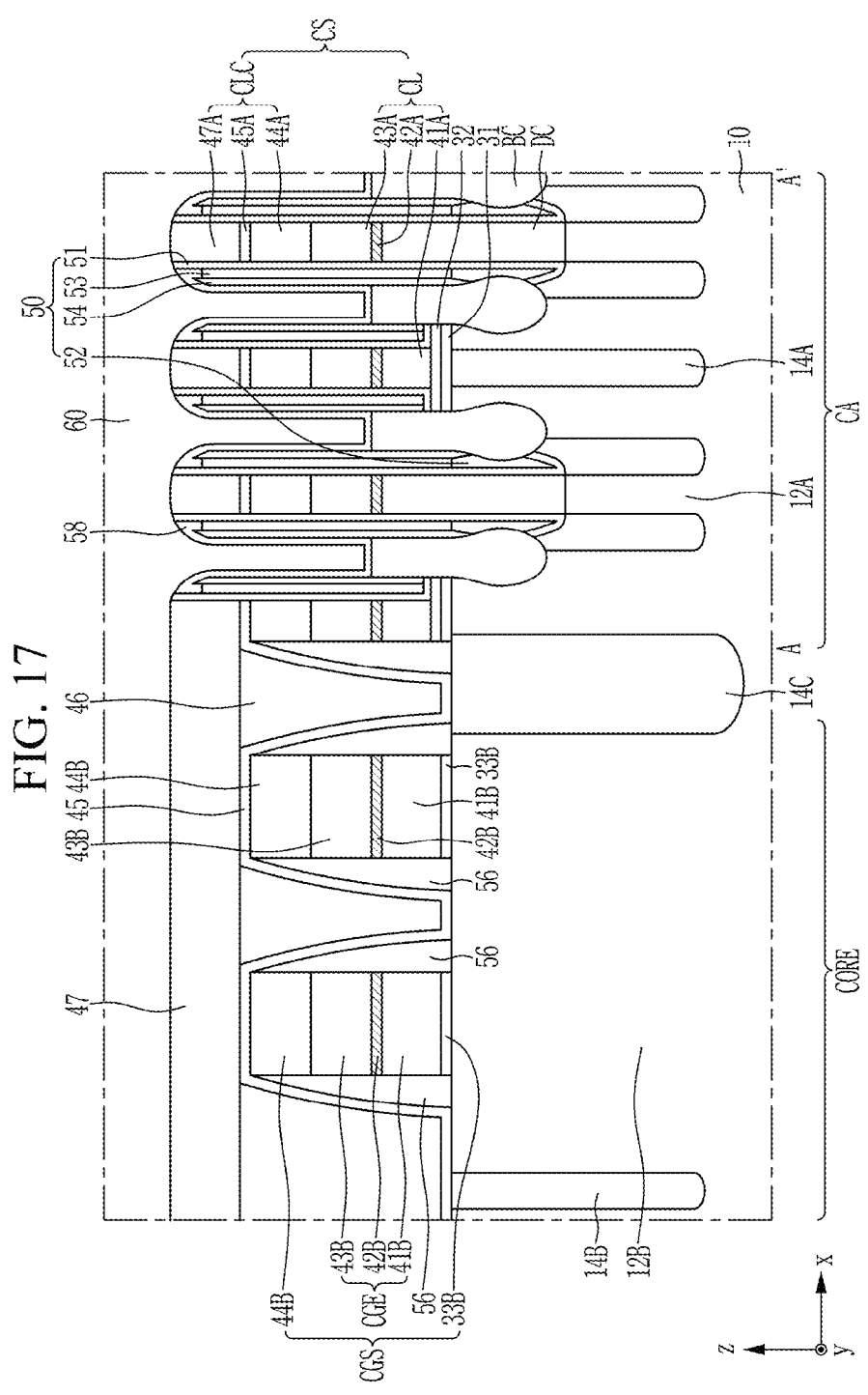

In the method of manufacturing a semiconductor device according to some example embodiments according to the technical concept of the present inventive concepts, a dummy mold layer 60 (see FIG. 17) is used to improve a step difference occurring at the upper boundary between the cell array region CA and the core region CORE (see FIG. 17). In addition, a dummy mold pattern 60P remaining after controlling the heights of the top surfaces of the cell array region CA and the core region CORE may be used instead of a mask for protecting the cell array region CA when a contact plug hole CPH of the core region CORE is etched (see FIGS. 18 and 19). Accordingly, the exposed surface of the storage element contact BC may be protected, and a contact plug spacer 59 may be formed in the contact plug hole CPH of the core region CORE.

Figure 6:
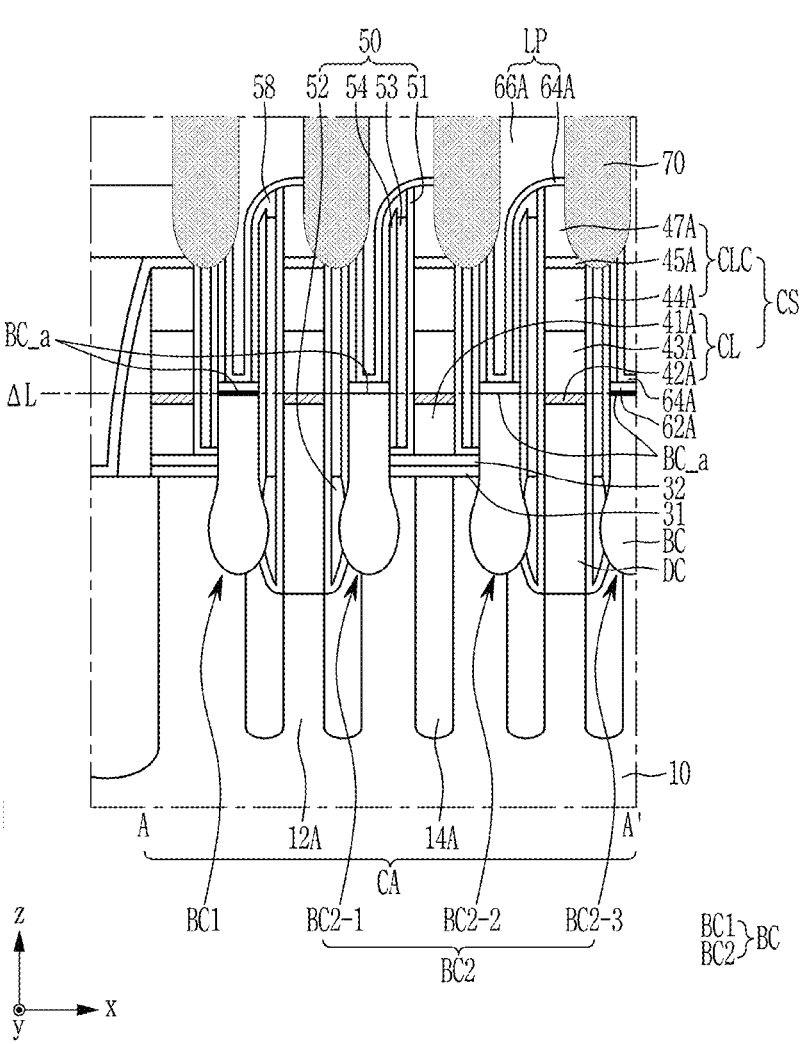
FIGS. 6 and 7 are portions of FIG. 2, and are cross-sectional views illustrating a top step difference between storage element contacts according to some example embodiments.
Figure 7:
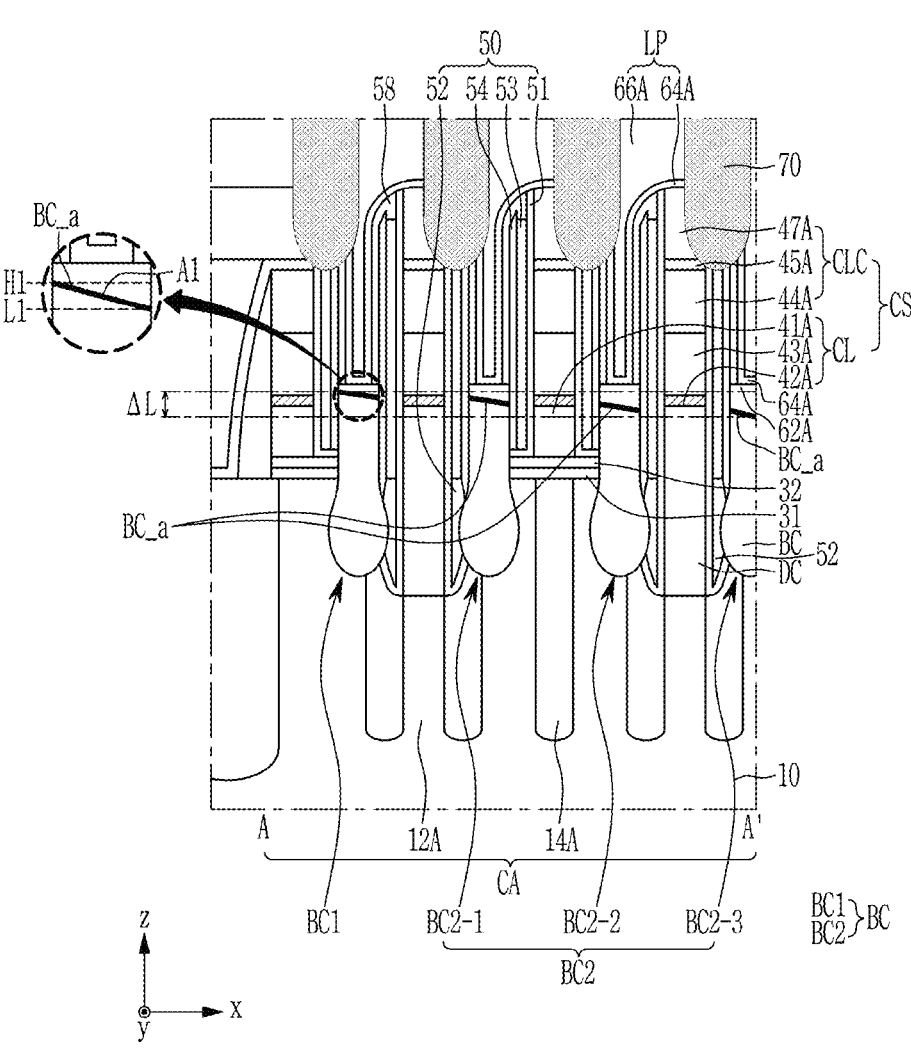

FIGS. 6 and 7 are portions of FIG. 2, and are cross-sectional views illustrating a top step difference between storage element contacts according to some example embodiments.

Referring to FIG. 6, in an ideal example, a top surface step difference ΔL between the plurality of storage element contacts BC (e.g., a difference between the respective distances, or top surface heights, of the top surfaces BC_a thereof in the z direction from a reference location such as the top surface 10a or the bottom surface 10b of the substrate 10) may be 0 nm. The step difference between separate top surfaces BC_a of the plurality of storage element contacts BC may be understood to refer to a step difference in a vertical direction perpendicular to the substrate 10 (e.g., the z direction) between the separate top surfaces BC_a. In this way, when the top surface heights of the plurality of storage element contacts BC are all the same (e.g., the top surfaces BC_a of the plurality of storage element contacts BC are coplanar), the possibility that all cells in the cell array region CA are used as effective cells may increase. Accordingly, the semiconductor device may have more cell elements in the same area and thus may have improved miniaturization and/or improved operational performance, based on the step difference (e.g., step different in top surface height) between the top surfaces BC_a of the plurality of storage element contacts BC being 0 nm.

However, the height of the top surface BC_a of the actually manufactured storage element contact BC may not be completely the same as that illustrated in FIG. 6. In some example embodiments, the top surface height BC_a of the storage element contact BC may gradually decrease from the core region CORE to the center of the cell array region CA. In this case, the cells including the storage element contacts BC disposed close to the core region CORE having an uneven height of the top surface BC_a may cause defects, thereby potentially reducing reliability and/or operational performance of the cells and thus of the semiconductor device and further reducing the number of effective cell elements in a same area, thereby reducing operational performance and/or miniaturization. Accordingly, as the top surface BC_a of the storage element contact BC disposed closer to the core region CORE has a more even shape, the number of effective cells within the same area may increase, thereby improving operational performance and/or miniaturization of the semiconductor device.

According to some example embodiments according to the technical concept of the present inventive concepts, the top surface of any one first storage element contact BC closest to the core region CORE may have a step difference ΔL of 5 nm or less (e.g., 0 nm to about 5 nm, about 0.01 nm to about 5 nm, about 0.01 nm to about 4 nm, about 0.01 nm to about 3 nm, about 0.01 nm to about 2 nm, about 0.01 nm to about 1 nm, or the like) with the top surface of any one second storage element contacts BC among a plurality of storage element contacts BC first to tenth away from the first storage element contact BC. For example, as shown in at least FIGS. 2, 6, and 7, the plurality of storage element contacts BC may include a first storage element contact BC1 which is the closest storage element contact BC of the plurality of storage element contacts BC to the core region CORE in a given horizontal direction (e.g., x direction as shown in FIGS. 2, 6, and 7) and one or more second storage element contacts BC2 that are distal from the core region CORE in relation to the first storage element contact BC1 such that the first storage element contact BC1 is between the core region CORE and the one or more second storage element contacts BC2 in the given horizontal direction. In some example embodiments, the one or more second storage element contacts BC2 may include a sequential arrangement of one or more second storage contacts BC2-1 to BC2-n that are understood to be the first to "nth" second storage element contacts, respectively, away from a given first storage element contact BC1 in a given horizontal direction, where "n" may be any natural number. For example, while FIGS. 2, 6, and 7 show that the second storage element contacts BC2 may include first to third second storage element contacts BC2-1, BC2-2, and BC2-3 sequentially aligned with a first storage element contact BC1 in a given horizontal direction (e.g., x direction) and thus being first to third second storage element contacts away from the shown first storage element contact BC1 in the x direction, it will be understood that the second storage element contacts BC2 may include first to nth second storage element contacts BC2-1 to BC2-$n$ where "n" may be equal to or greater than 10 such that the second storage element contacts BC2 may include first to tenth second storage element contacts BC2-1 to BC2-10 sequentially aligned with a first storage element contact BC1 and thus understood to be first to tenth second storage element contacts away from the first storage element contact BC1 in a given horizontal direction (e.g., x direction). In some example embodiments a step difference ΔL in the vertical direction perpendicular to the substrate 10 (e.g., the z direction) between the top surface BC_a of any given first storage element contact BC1 and a top surface BC_a of any one second storage element contact BC2 sequentially aligned with the first storage element contact BC1 in a given horizontal direction (e.g., x direction), such as a top surface of any one of a first to tenth second storage element contact BC2-1 to BC2-10 that are the first to tenth storage element contacts away from the first storage element contact in the given horizontal direction may be 5 nm or less.

In some example embodiments, the top surface BC_a of the first storage element contact BC1 may have a step difference ΔL of 5 nm or less with the top surface BC_a of any one second storage element contact BC2 among the plurality of storage element contacts BC2 second to tenth, third to tenth, fourth to tenth, fifth to tenth, sixth to tenth, seventh to tenth, eights to tenth, ninth and tenth, or tenth away from the top surface BC_a of the first storage element contact BC1.

In this case, the second storage element contact BC2 may be farther from the core region CORE than the first storage element contact BC1. That is, the top surface step difference ΔL between the first storage element contact BC1 disposed close to the core region CORE and the second storage element contact BC2 disposed closer to the center of the cell array region CA than the first storage element contact BC1 may be very small within the aforementioned range.

The top surface step difference ΔL between the first and second storage element contacts BC1 and BC2 may be, for example, 5 nm or less, 4 nm or less, 3 nm or less, 2 nm or less, or 1 nm or less (e.g., 0 nm to about 5 nm, about 0.01 nm to about 5 nm, about 0.01 nm to about 4 nm, about 0.01 nm to about 3 nm, about 0.01 nm to about 2 nm, about 0.01 nm to about 1 nm, or the like). As the top surface step difference ΔL between the first and second storage element contacts BC is lower, it is advantageous, so that the lower limit thereof may be 0 nm.

Since the top surface step difference ΔL of the plurality of storage element contacts BC is very small as in the above range, according to some example embodiments according to the technical idea of the present inventive concepts, the number of effective cells for the same area may be increased by reducing the number of dummy cells, thereby improving operational performance and/or miniaturization of the semiconductor device.

Referring to FIG. 7, when the top surface BC_a of the storage element contact BC is uneven, the height measurement position of the top surface BC_a may be determined by an intermediate position A1 between the highest tangent line H1 and the lowest tangent line L1 among tangent lines parallel to the substrate 10 that is in contact with the top surface BC_a of the storage element contact BC. In FIG. 7, the storage element contact BC disposed at the rightmost side (e.g., second storage element contact BC2-3) may be understood as the contact third away from the first storage element contact BC1 closest to the core region CORE (that is, the storage element contact BC disposed at the leftmost side in FIG. 7).

The cell spacer 58 may be disposed to cover sidewalls of the cell line spacers 50 disposed on both sidewalls of the cell line structure CS and a sidewall of the fence 48A that is in contact with the landing pad LP. Referring to FIG. 2, in some example embodiments, a portion of the cell line spacer 50 may be etched in the process of forming the storage element contact hole (BCH of FIG. 14). Accordingly, the cell spacer 58 may be formed to cover an upper portion of the cell line spacer 50.

As will be described later, the cell spacer 58 disposed in the cell array region CA may be formed before (e.g., prior to) forming the contact plug hole CPH. That is, the contact plug spacer 59 and the cell spacer 58 are not formed at the same time. Accordingly, the cell spacer 58 may be formed with a thin thickness, and the contact plug spacer 59 may be formed thick to secure a sufficient separation distance from the core gate structure CGS. The thickness may mean a width in a direction parallel to the substrate 10 (e.g., the x direction and/or the y direction).

The landing pad LP may be disposed on the storage element contact BC. The landing pad LP may be electrically connected to the storage element contact BC. The landing pad LP may be connected to the storage element connection region of the active region AC.

The landing pad LP may overlap a portion of the top surface of the cell line structure CS.

Referring to FIG. 2, the landing pad LP may include a first conductive barrier pattern 64A and a seventh conductive pattern 66A. The first conductive barrier pattern 64A may have, for example, Ti, TiN, or a stacked structure of Ti/TiN. The seventh conductive pattern 66A may include, for example, at least one of a semiconductor material doped with impurities, a conductive silicide compound, a conductive metal nitride, a conductive metal carbide, a metal, or a metal alloy.

A pad isolation insulating layer 70 may be disposed on the landing pad LP and the cell line structure CS. For example, the pad isolation insulating layer 70 may be disposed on the cell line capping layer CLC. The pad isolation insulating layer 70 may define the landing pad LP by forming a plurality of isolation regions. A pad isolation insulating layer 70 may not cover (e.g., may expose) the top surface of the landing pad LP. The pad isolation insulating layer 70 may separate (e.g., isolate from direct contact) adjacent landing pads LP. For example, with respect to the top surface 10a of the substrate 10, the height of the top surface of the landing pad LP may be the same as that of (e.g., may be coplanar with) the top surface of the pad isolation insulating layer 70.

The pad isolation insulating layer 70 may include an insulating material and may electrically separate the plurality of landing pads LP from each other. For example, the pad isolation insulating layer 70 may include, for example, at least one of silicon oxide, silicon nitride, silicon oxynitride, silicon oxycarbonitride, or silicon carbonitride.

Referring to FIG. 2, the element isolation pattern 14B may be disposed in the substrate 10 in the core region CORE. The element isolation pattern 14B may define the active region 12B in the core region CORE. The top surface of the element isolation pattern 14B is illustrated as being on the same level as the top surface of the substrate 10, but is not limited thereto.

The core gate structure CGS may be disposed on the substrate 10 in the core region CORE. The core gate structure CGS may be disposed on the active region 12B defined by the element isolation pattern 14B.

The core gate structure CGS may include a core gate dielectric pattern 33B, core gate electrodes CGE (41B, 42B, and 43B), and a core gate capping pattern 44B sequentially stacked on the substrate 10. The core gate structure CGS may include a core gate spacer 56 disposed on a sidewall of the core gate electrode CGE and a sidewall of the core gate capping pattern 44B.

The core gate electrode CGE may include a fourth conductive pattern 41B, a fifth conductive pattern 42B, and a sixth conductive pattern 43B sequentially stacked on the core gate dielectric pattern 33B. For example, an additional conductive pattern may not be disposed between the core gate electrode CGE and the core gate dielectric pattern 33B. As another example, unlike some example embodiments, including the example embodiments shown in FIG. 2, an additional conductive pattern, such as a work function conductive pattern (not illustrated), may be disposed between the core gate electrode CGE and the core gate dielectric pattern 33B.

In the drawings, it is illustrated that the two core gate structures CGS are disposed between the adjacent element isolation patterns 14B, but this is only for convenience of description, and the present inventive concepts are not limited thereto.

An insulating liner 45 may be disposed on the substrate 10. The insulating liner 45 may be disposed along the profile of the core gate structure CGS. The insulating liner 45 may also be disposed on a top surface of the cell region isolation pattern 14C, and the core gate spacer 56 and the core gate capping pattern 44B disposed on the cell region isolation pattern 14C. The insulating liner 45 may be formed in the same process as the cell line insulating pattern 45A of the cell array region CA. The insulating liner 45 may include the same material as that of the cell line insulating pattern 45A of the cell array region CA. With respect to the top surface of the substrate 10, the height of the top surface of the insulating liner 45 may be the same as that of the top surface of the cell line insulating pattern 45A of the cell array region CA.

The insulating liner 45 may include, for example, at least one of silicon nitride, silicon oxynitride, silicon carbonitride, and silicon oxycarbonitride.

A buried insulating layer 46 may be disposed between the plurality of core gate structures CGS. According to some example embodiments, when the insulating liner 45 is disposed, the buried insulating layer 46 may be disposed on the insulating liner 45. The buried insulating layer 46 may also be disposed on the cell region isolation pattern 14C.

The buried insulating layer 46 may be formed of an insulating material having excellent gap fill characteristics. The buried insulating layer 46 may be formed of, for example, a boron-phosphor silicate glass (BPSG) film, a high density plasma (HDP) oxide film, an $O_3$-TEOS film, an undoped silicate glass (USG), or a Tonen Silazane (TOSZ) material. In some example embodiments, the buried insulating layer 46 may include silicon oxide formed of a Tonen Silazane (TOSZ) material.

A top surface of the buried insulating layer 46 may be on the same level as the insulating liner 45 extending along the top surface of the core gate structure CGS, but is not limited thereto. According to some example embodiments, when the insulating liner 45 is not formed, the top surface of the buried insulating layer 46 may be on the same level as the top surface of the core gate structure CGS.

A mask layer 47 may be disposed on the core gate structure CGS and the buried insulating layer 46. According to some example embodiments, when the insulating liner 45 is formed, the mask layer 47 may cover the insulating liner 45 extending along the top surface of the core gate structure CGS and the buried insulating layer 46.

The height of the top surface of the mask layer 47 may be the same as, for example, the height of the top surface of the cell line capping layer CLC based on the top surface of the substrate 10.

In some example embodiments, the mask layer 47 may include a material different from that of the buried insulating layer 46. For example, when the buried insulating layer 46 includes silicon oxide, the mask layer 47 may include at least one of silicon nitride, silicon oxynitride, silicon carbonitride, or silicon oxycarbonitride, but is not limited thereto.

Contact plugs CP may be disposed on both sides of the core gate structure CGS. The contact plug CP may pass through the mask layer 47 and the buried insulating layer 46 and extend to the substrate 10 of the core region CORE. The contact plug CP may contact the substrate 10 in the core region CORE. Wiring lines (not illustrated) may be disposed on the mask layer 47. The contact plug CP and the wiring line (not illustrated) may be separated by a wiring isolation recess (not illustrated).

In some example embodiments, as the contact plug CP is formed simultaneously with the landing pad LP, the contact plug CP may include the same material as that of the landing pad LP.

The contact plug CP may include a second conductive barrier pattern 64B and an eighth conductive pattern 66B. The second conductive barrier pattern 64B may be formed at the same time as the first conductive barrier pattern 64A of the landing pad LP and include the same material, and the eighth conductive pattern 66B may be formed at the same time as the seventh conductive pattern 66A of the landing pad LP and include the same material.

As will be described later, in the process of removing the dummy mold pattern 60P (see FIG. 19), a portion exposed by the contact plug hole CPH may be partially etched. That is, a portion of the buried insulating layer 46 and/or a portion of the core gate spacer 56 exposed by the contact plug hole CPH may be etched. As a result, the inside of the contact plug hole CPH may be widened.

Figure 8:
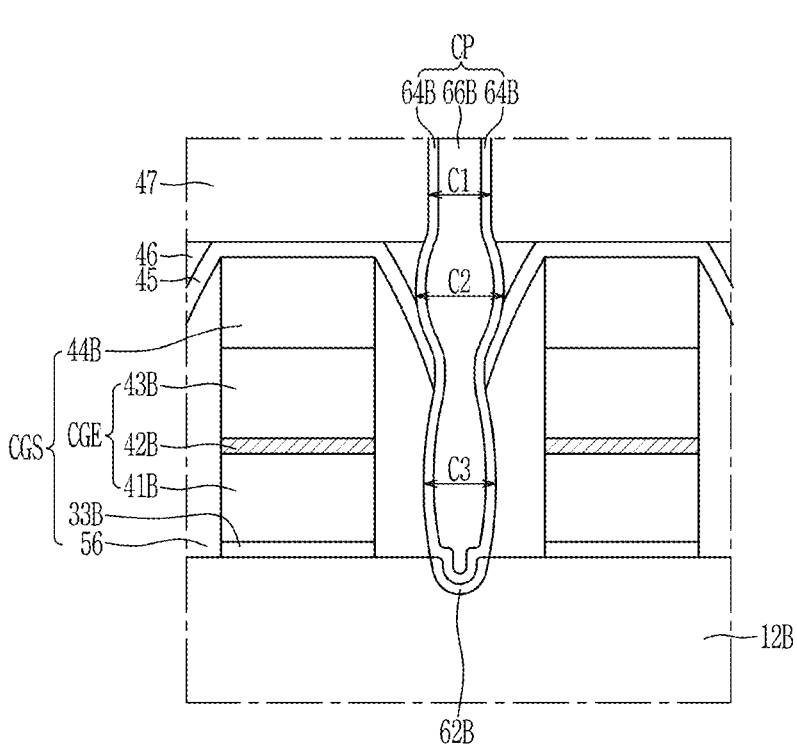
FIG. 8 is a cross-sectional view of a contact plug in which a contact plug spacer is not formed according to a comparative example.

FIG. 8 is a cross-sectional view of a contact plug in which a contact plug spacer is not formed according to a comparative example.

Referring to FIG. 8, in the final manufactured semiconductor device, the contact plug CP has a shape in which a second width C2 of the middle portion or a third width C3 of the lower portion is greater than a first width C1 of the upper portion.

Here, the first width C1 may mean the widest width measured in a direction horizontal to the substrate 10 from the top of the contact plug CP, the second width C2 may mean the widest width measured in a direction horizontal to the substrate 10 at the middle portion of the contact plug CP, and the third width C3 may mean the widest width measured in a direction horizontal to the substrate 10 from the bottom of the contact plug CP.

Referring to FIG. 8, in some example embodiments, a first width C1 is a width measured at a portion of the contact plug CP penetrating the mask layer 47, the second width C2 is a width measured at a portion passing through the buried insulating layer 46 of the contact plug CP, and the third width C3 may be a width measured at a portion passing between two adjacent core gate spacers 56 of the contact plug CP.

When the second width C2 or the third width C3 is greater than the first width C1 of the contact plug CP, the contact plug CP does not secure a sufficient separation distance from the core gate structure CGS, and a defective electrical short may occur between the contact plug CP and the core gate structure CGS.

In order to solve the problem, according to some example embodiments according to the technical idea of the present inventive concepts, the contact plug spacer 59 may be disposed on a sidewall (e.g., directly or indirectly on a sidewall) of the contact plug CP. Accordingly, the contact plug CP may be surrounded (e.g., horizontally surrounded) by the contact plug spacer 59.

Referring to FIG. 2, the contact plug spacer 59 may not be disposed on the bottom surface of the contact plug CP, but may be disposed on a sidewall of the contact plug CP. The contact plug spacer 59 may include, for example, at least one of silicon nitride, silicon oxynitride, silicon carbonitride, or silicon oxycarbonitride.

Figure 9:
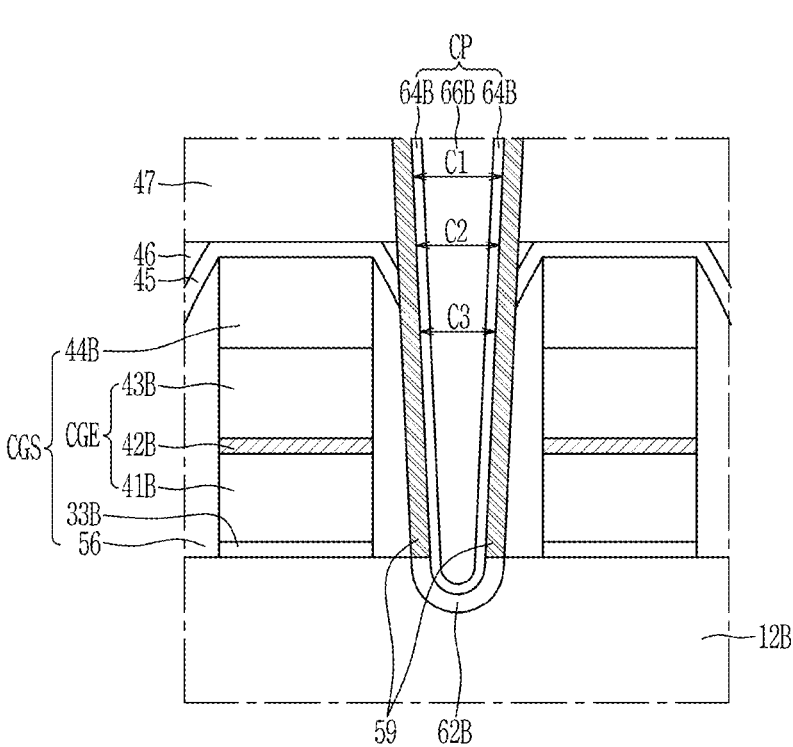
FIG. 9 is a cross-sectional view of a contact plug in which a contact plug spacer is formed according to some example embodiments.

FIG. 9 is a cross-sectional view of a contact plug in which a contact plug spacer is formed according to some example embodiments.

As illustrated in FIG. 9, when the contact plug spacer 59 is formed, the first width C1 of the contact plug CP may be equal to or greater than the second width C2. That is, the first width C1 measured at the portion of the contact plug CP penetrating the mask layer 47 may be equal to or greater than the second width C2 measured at the portion of the contact plug CP penetrating the buried insulating layer 46. In other words, in the process of removing the dummy mold pattern 60P (see FIG. 19) of the cell array region CA after forming the contact plug hole CPH, the buried insulating layer 46 is protected by the contact plug spacer 59, so that the second width C2 may not be wider than the first width C1.

Also, as illustrated in FIG. 9, when the contact plug spacer 59 is formed, the first width C1 of the contact plug CP may be equal to or greater than the third width C3. That is, the first width C1 measured at the portion of the contact plug CP passing through the mask layer 47 may be equal to or greater than the third width C3 measured at the portion of the contact plug CP passing through a portion of the core gate spacer 56. In other words, in the process of removing the dummy mold pattern 60P (see FIG. 19) of the cell array region CA after forming the contact plug hole CPH, the core gate spacer 56 is protected by the contact plug spacer 59, so that the third width C3 may not be wider than the first width C1.

In some example embodiments, as the second width C2 and the third width C3 are not greater than the first width C1, the first width C1 of the contact plug CP may be equal to or greater than the second width C2 and may be equal to or greater than the third width C3.

In some example embodiments, the contact plug spacer 59 may be applied to all contact plugs CP in the core region CORE. In some example embodiments, the contact plug spacer 59 is also applicable to the contact plug CP connected to the BCAT and/or the contact plug CP connected to the core gate electrode CGE. However, the contact plug spacer 59 is not limited thereto, and the contact plug spacers 59 may be disposed only on sidewalls of some contact plugs CP in the core region CORE.

Referring to FIGS. 8 and 9, the contact plug spacer 59 may be particularly useful for a highly scaled semiconductor device by increasing the separation distance between the contact plug CP and the core gate structure CGS.

Referring to FIGS. 8 and 9, the size of the contact plug hole CPH may be controlled by the contact plug spacer 59 after forming the contact plug hole CPH to be larger than a desired size. Accordingly, the aspect ratio of the contact plug hole CPH to be patterned is reduced, so that there is an advantage in reducing the burden of the patterning process, such that a process of manufacturing the semiconductor device may have reduced complexity and thus reduced cost and/or reduced risk of manufacturing defects based on the contact plug spacer 59 being present such that the aspect ratio of the contact plug hole CPH to be patterned is reduced.

FIGS. 10, 11, 12, 13, 14, 15, 16, 17, 18, 19, 20, and 21 are cross-sectional views according to process sequences to describe a method of manufacturing a semiconductor device according to some example embodiments according to the technical concept of the present inventive concepts.

In some example embodiments, some components disposed in the cell array region CA may be formed simultaneously with some components disposed in the core region CORE.

Figure 10:
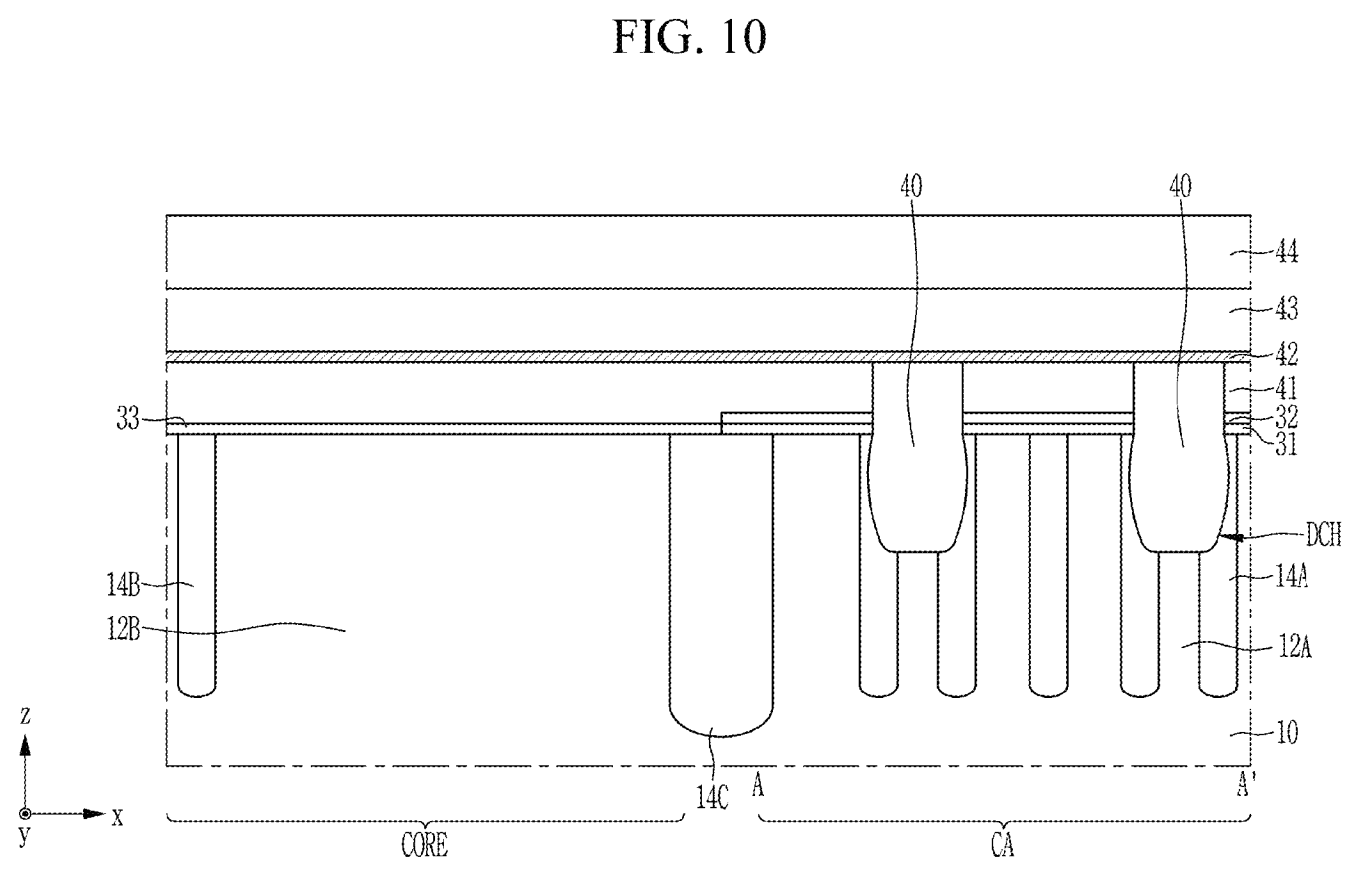

Referring to FIG. 10, the element isolation patterns 14A and 14B and the cell region isolation patterns 14C may be formed on the substrate 10. The element isolation patterns 14A and 14B and the cell region isolation pattern 14C may be formed through a shallow trench isolation STI process.

The cell array region CA and the core region CORE separated by the cell region isolation pattern 14C may be formed on the substrate 10. A plurality of active regions 12A and 12B defined by the element isolation patterns 14A and 14B may be formed in the cell array region CA and the core region CORE.

According to some example embodiments, in a method of manufacturing a semiconductor device including a word line of a buried structure, a word line of a buried structure may be formed on a substrate before forming a bit line.

According to some example embodiments, in order to manufacture the semiconductor device including the word line of the buried structure, a plurality of cell gate trenches T1 (see FIG. 3) may be formed in the cell array region CA of the substrate 10. The plurality of cell gate trenches T1 (see FIG. 3) may extend parallel to each other along the first direction (x direction) of FIG. 1 and may have a line shape crossing the plurality of active regions 12A, respectively. A cell gate insulating layer 22, a cell gate electrode 24, and a cell gate capping pattern 26 may be sequentially formed in the cell gate trench T1 (see FIG. 3). As described above, the cell gate electrode 24 may correspond to the word line WL.

In some example embodiments, a cell gate capping conductive layer (not illustrated) may be additionally formed between the cell gate electrode 24 and the cell gate capping pattern 26.

A top surface of the cell gate capping pattern 26 may be positioned at substantially the same level as the top surface of the substrate 10.

In some example embodiments, after forming the word line WL, impurity ions are implanted into the substrate 10 corresponding to both sides of the word line WL to form source/drain regions on the top surface of the plurality of active regions 12A. In some example embodiments, an impurity ion implantation process for forming source/drain regions may be performed before forming the word line WL.

Referring to FIG. 10, after sequentially forming a first insulating film 31 and a second insulating film 32 in the cell array region CA and the core region CORE of the substrate 10, in the core region CORE, the active region 12B of the substrate 10 may be exposed again by removing the first insulating film 31 and the second insulating film 32. Thereafter, a gate dielectric film 33 may be formed in the core region CORE of the substrate 10 in the state where the cell array region CA is covered with a mask pattern (not illustrated). In FIG. 10, it is illustrated that sidewalls of the first and second insulating films 31 and 32 and the sidewall of the gate dielectric film 33 are in contact at the midpoint of the cell region isolation pattern 14C, but the first and second insulating films 31 and 32 and the gate dielectric film 33 may overlap or not contact the cell region isolation pattern 14C.

A third insulating film (not illustrated) may be formed on the second insulating film 32.

The first insulating film 31 may be formed of an oxide film, the second insulating film 32 may be formed of a nitride film, and the third insulating film (not illustrated) may be formed of an oxide film, but the present inventive concepts are not limited thereto.

The gate dielectric film 33 may be formed of at least one selected from a silicon oxide film, a silicon nitride film, a silicon oxynitride film, an oxide/nitride/oxide (ONO) film, or a high-k dielectric film having a higher dielectric constant than a silicon oxide film. For example, the gate dielectric film 33 may have a dielectric constant of about 10 to about 25. In some example embodiments, the gate dielectric film 33 may include at least one material selected from the group consisting of hafnium oxide (HfO), hafnium silicate (Hf-SiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 33 may include at least one material selected from the group consisting of $HfO_2$, $Al_2O_3$, $HfAlO_3$, $Ta_2O_3$, and $TiO_2$.

Thereafter, a first conductive layer 41 may be formed on the second insulating film 32 and the gate dielectric film 33.

The first conductive layer 41 may include a doped semiconductor material (for example, doped polysilicon), but is not limited thereto.

A mask pattern (not illustrated) may be formed on the first conductive layer 41. The mask pattern (not illustrated) may have an opening exposing a portion of the first conductive layer 41 of the cell array region CA. The core region CORE may not be exposed to the outside by being covered by the mask pattern (not illustrated).

Thereafter, a direct contact hole DCH exposing the active region 12A of the substrate 10 may be formed in the cell array region CA by etching the first conductive layer 41 exposed through the opening of the mask pattern (not illustrated), and then etching portions of the second insulating film 32, the active region 12A, and the element isolation pattern 14A which are exposed as a result of the etching of the first conductive layer.

The mask pattern (not illustrated) may be formed of a hard mask pattern formed of an oxide film or a nitride film. A photolithography process may be used to form the mask pattern (not illustrated).

After the mask pattern (not illustrated) is removed, a sixth conductive layer 40 having a thickness sufficient to fill the direct contact hole DCH may be formed in the inside of the direct contact hole DCH and on the top of the first conductive layer, and the sixth conductive layer 40 may be etched so that the sixth conductive layer 40 remains only inside the direct contact hole DCH. The sixth conductive layer 40 may include the same material as the first conductive layer 41, but is not limited thereto. Next, a second conductive layer 42, a third conductive layer 43, and a capping layer 44 may be sequentially formed on the top of the first conductive layer 41 in the cell array region CA and the core region CORE.

Each of the second conductive layer 42 and the third conductive layer 43 may include, for example, at least one of a conductive silicide compound, a conductive metal nitride, a metal, or a metal alloy. As a more specific example, the second conductive layer 42 may include at least one of a conductive silicide compound and a conductive metal nitride, and the third conductive layer 43 may include at least one of a metal or a metal alloy, but the present inventive concepts are not limited thereto. The capping layer 44 may include, for example, at least one of silicon nitride, silicon oxynitride, silicon carbonitride, or silicon oxycarbonitride.

Figure 11:
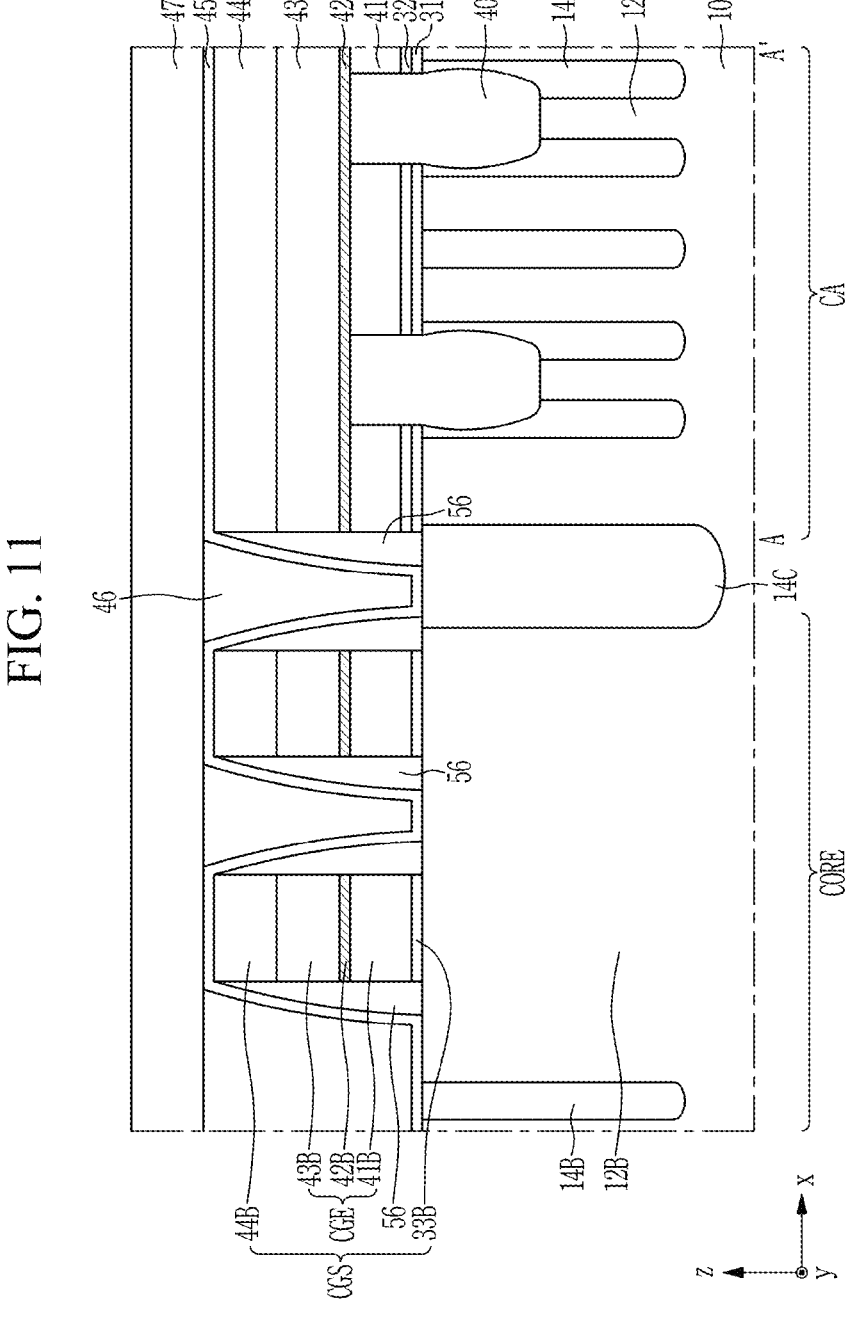

Referring to FIG. 11, in a state in which the cell array region CA is covered with the mask pattern (not illustrated), the gate dielectric film 33, the first conductive layer 41, the second conductive layer 42, the third conductive layer 43, and the capping layer 44 of the core region CORE may be patterned. As a result, a core gate electrode CGE in which the fourth conductive pattern 41B, the fifth conductive pattern 42B, and the sixth conductive pattern 43B are stacked is formed on the core gate dielectric pattern 33B. A core gate capping pattern 44B may be disposed on the core gate electrode CGE.

A core gate spacer 56 may be formed on both sidewalls (e.g., opposite sidewalls) of the stacked structure of the core gate dielectric pattern 33B, the core gate electrode CGE, and the core gate capping pattern 44B. As described above, the core gate structure CGS may include the core gate electrodes 41B, 42B, and 43B (CGE) and the core gate capping pattern 44B sequentially stacked on the core gate dielectric pattern 33B, and the core gate spacer 56 disposed on the sidewall of the core gate electrode CGE and the side wall of the core gate capping pattern 44B.

The core gate spacer 56 may include oxide, nitride, or a combination thereof, but is not limited thereto.

The core gate spacer 56 may also be formed on the etched sidewalls of the first and second insulating films 31 and 32, the first to third conductive layers 41, 42 and 43, and the capping layer 44 on the cell region isolation pattern 14C together with both sidewalls of the stacked structure of the core gate dielectric pattern 33B, the core gate electrode CGE, and the core gate capping pattern 44B in the core region CORE.

After that, an insulating liner 45 may be formed on the entire surface of the core region CORE and the cell array region CA. The insulating liner 45 may include, for example, at least one of silicon nitride, silicon oxynitride, silicon carbonitride, and silicon oxycarbonitride.

A space between the core gate structures CGS may be filled with the buried insulating layer 46. According to some example embodiments, the buried insulating layer 46 may be formed to fill a space between the core gate structure CGS and the insulating liner 45 covering the core gate structure CGS. The buried insulating layer 46 may be formed of an insulating material having excellent gap fill characteristics. The buried insulating layer 46 may be formed of, for example, a boron-phosphor silicate glass (BPSG) film, a high density plasma (HDP) oxide film, an $O_3$-TEOS film, an undoped silicate glass (USG), or a Tonen Silazane (TOSZ) material. In addition, the buried insulating layer 46 may be formed by using at least one of thin film formation techniques that provide excellent step difference coverage. For example, the buried insulating layer 46 may be formed by performing a deposition method, such as chemical vapor deposition (CVD), sub-atmospheric CVD (SACVD), low pressure CVD (LPCVD), plasma enhanced CVD (PECVD), or physical vapor deposition (PVD).

In some example embodiments, the buried insulating layer 46 may be formed by using Tonen Silazane (TOSZ). The TOSZ film may be a polysilazane film. The TOSZ film may be formed by a spin coating method, and after spin coating, a silicon oxide film may be formed by supplying $O_2$ and $H_2O$ and performing an annealing process to remove ammonia and hydrogen from the TOSZ film. That is, the TOSZ film may be made into the silicon oxide film.

Thereafter, the top surface of the buried insulating layer 46 may be planarized by a planarization process. Accordingly, the top surface of the buried insulating layer 46 may be on the same level as the top surface of the insulating liner 45, but is not limited thereto.

The mask layer 47 may be formed on the insulating liner 45 and the buried insulating layer 46. As will be described later, the mask layer 47 formed in the cell array region CA may provide an etching mask for forming the cell conductive line CL along with the insulating liner 45 disposed thereunder. In addition, even after being used as the etching mask, the mask layer 47 and the insulating liner 45 remain on the cell conductive line CL to increase the height of the cell line structure CS, thereby spacing a landing pad LP (see FIG. 2) and the cell conductive line CL apart from each other and supporting the landing pad LP (see FIG. 2).

Meanwhile, the mask layer 47 formed in the core region CORE may serve as a mask for protecting the core region CORE while forming the cell line structure CS, the cell line spacer 50, and the storage element contact BC in the cell array region CA.

In some example embodiments, the mask layer 47 may include a material different from that of the buried insulating layer 46. For example, when the buried insulating layer 46 includes silicon oxide, the mask layer 47 may include at least one of silicon nitride, silicon oxynitride, silicon carbonitride, or silicon oxycarbonitride, but is not limited thereto.

Figure 12:
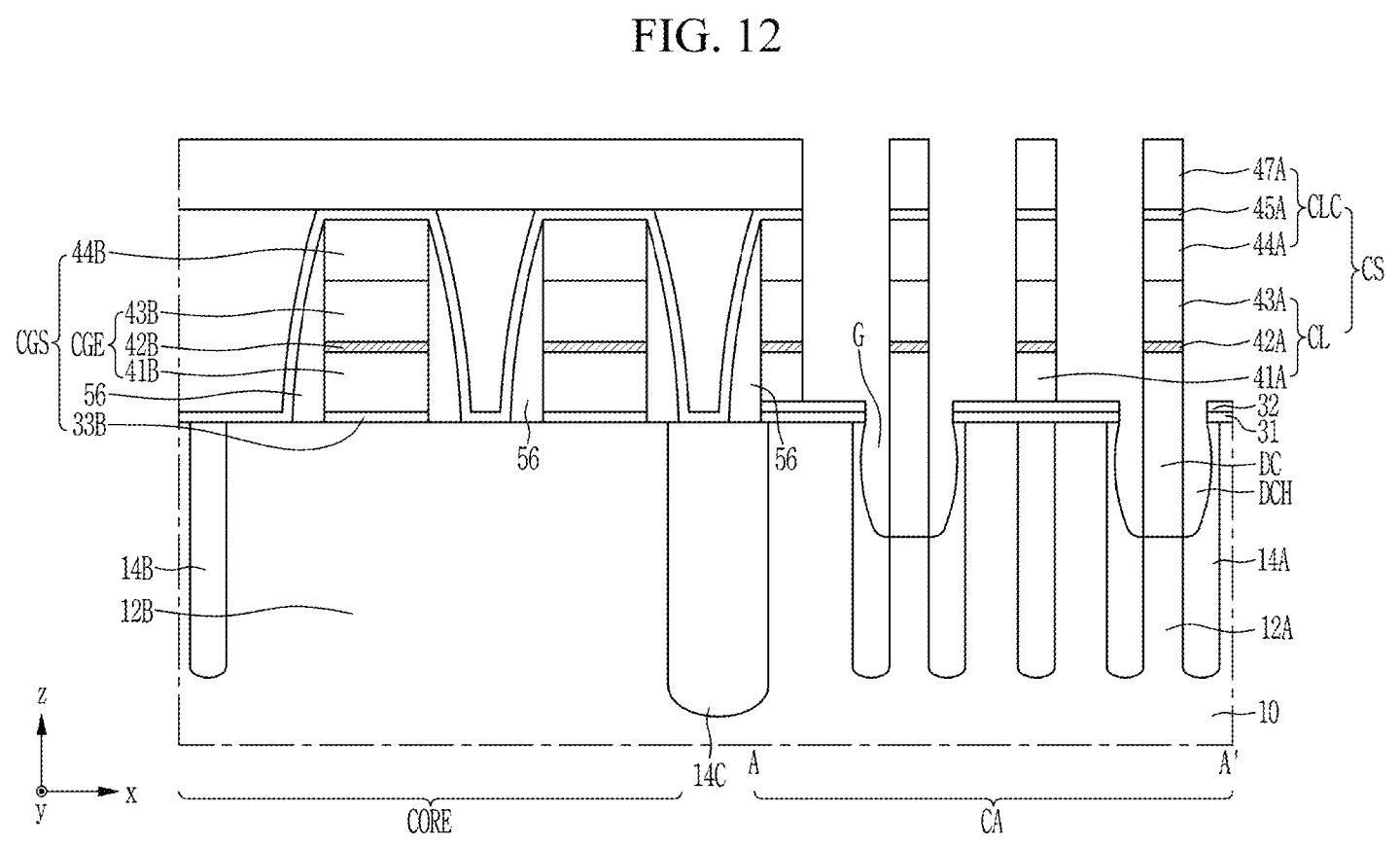

Referring to FIG. 12, the mask layer 47 and the insulating liner 45 of the cell array region CA may be patterned using a photolithography process. As a result, a first mask pattern 47A and a cell line insulating pattern 45A to be used as an etch mask for forming the cell conductive line CL may be formed in the cell array region CA.

Thereafter, the capping layer 44, the first to third conductive layers 41, 42, and 43, and the sixth conductive layer 40 (see FIG. 10) may be patterned by using the first mask pattern 47A and the cell line insulating pattern 45A as an etching mask. As a result, the cell conductive line CL in which the first conductive pattern 41A, the second conductive pattern 42A, and the third conductive pattern 43A are stacked may be formed in the cell array region CA. In addition, a direct contact DC may be formed in the direct contact hole DCH by etching the sixth conductive layer 40.

The cell conductive line CL may be connected to the active region 12A of the substrate 10 through the direct contact DC. The cell conductive line CL disposed on the direct contact DC may not include the first conductive pattern 41A, but may include the second conductive pattern 42A and the third conductive pattern 43A.

As the direct contact DC is formed, a gap G may be formed in the direct contact hole DCH. This is because the direct contact DC is etched and formed smaller than the diameter of the direct contact hole DCH. The gap G may be at least partially defined by one or more surfaces of the element isolation pattern 14A, a direct contact DC, or the like. The gap G may not have a surrounding shape surrounding the direct contact DC, but may be independently formed on both side walls of the direct contact DC. That is, one direct contact DC and a pair of gaps G exist in the direct contact hole DCH, and the pair of gaps G may be separated by the direct contact DC.

A cell line capping pattern 44A, a cell line insulating pattern 45A, and a first mask pattern 47A, which are sequentially stacked, may be disposed on the cell conductive line CL.

A cell line spacer 50 may be formed on sidewalls of the cell line structure CS and the direct contact DC.

Figure 13:
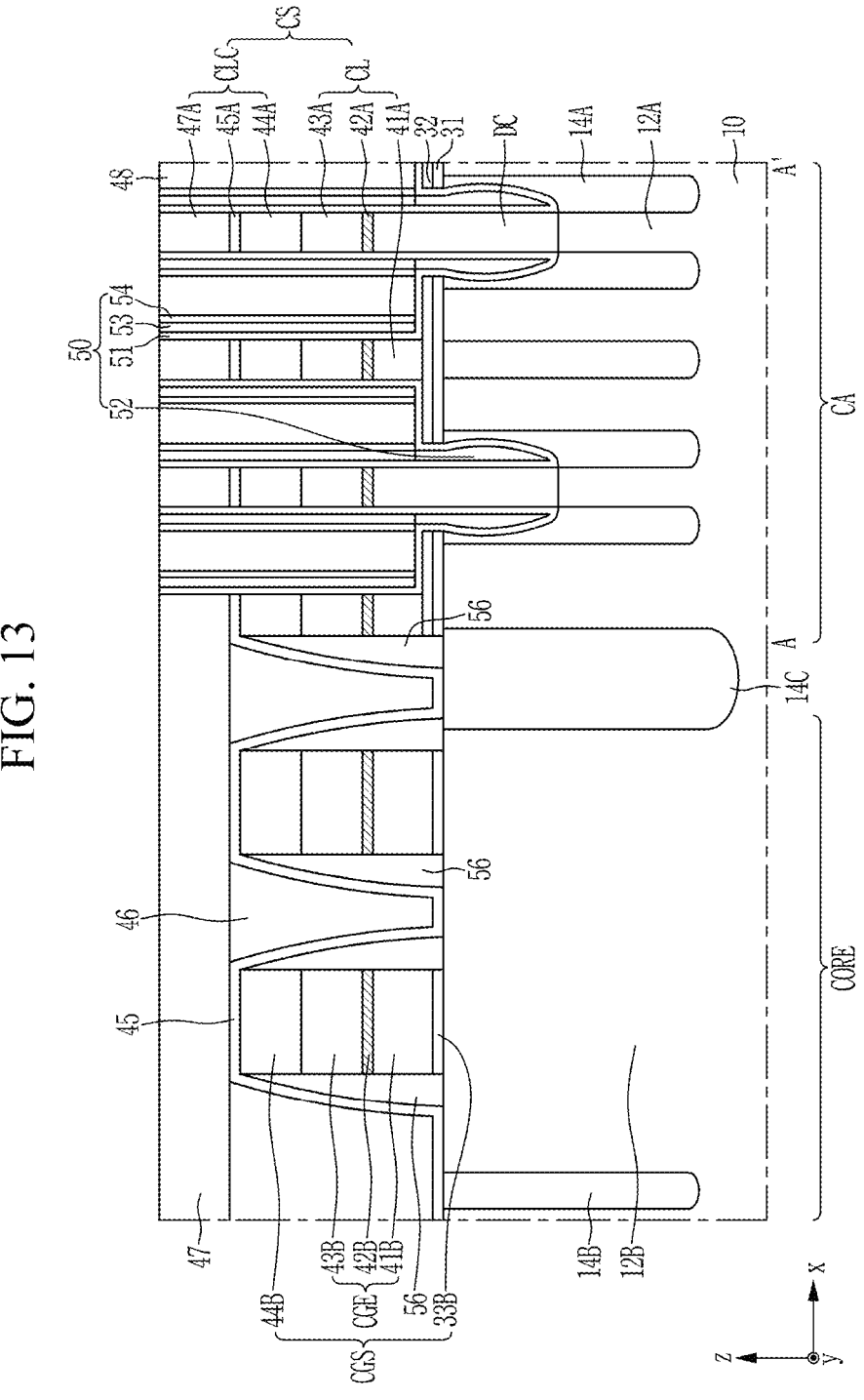

Referring to FIG. 13, the first spacer 51 may cover both sidewalls (e.g., opposite sidewalls) of the cell line structure CS, the surface of the gap G (e.g., a surface at least partially defining the gap G), and the top surface of the second insulating film 32. The second spacer 52 may fill the gap G of the direct contact hole DCH which is not filled by the first spacer 51. The third spacer 53 may be formed to cover the sidewalls of the first spacers 51 disposed on both sidewalls of the cell line structure CS. The fourth spacer 54 may be formed to cover sidewalls of the third spacers 53 disposed on both sidewalls of the cell line structure CS. The third and fourth spacers 53 and 54 may not fill the gap G. The first, second, and fourth spacers 51, 52, and 54 may include silicon nitride, the third spacer 53 may include silicon oxide, and the third spacer 53 may be replaced with air in a subsequent process, but the present inventive concepts are not limited thereto.

According to some example embodiments, the first, third, and fourth spacers 51, 53, and 54 may be formed even on the etched sidewalls of the first to third conductive layers 41, 42, and 43, the capping layer 44, the insulating liner 45, and the mask layer 47 on the cell region isolation pattern 14C.

Next, an insulating layer 48 for forming a fence (e.g., an insulating layer configured to form, or define, a fence) may be formed. A material film for forming the insulating layer 48 for forming the fence may be gap-filled between the cell line structures CS in which the cell line spacers 50 are formed. Thereafter, the material film may be planarized to expose an upper portion of the cell line structure CS to form the insulating layer 48 for forming the fence. The insulating layer 48 for forming the fence may include at least one of silicon oxide, silicon nitride, silicon oxynitride, or a combination thereof, but is not limited thereto.

Figure 14:
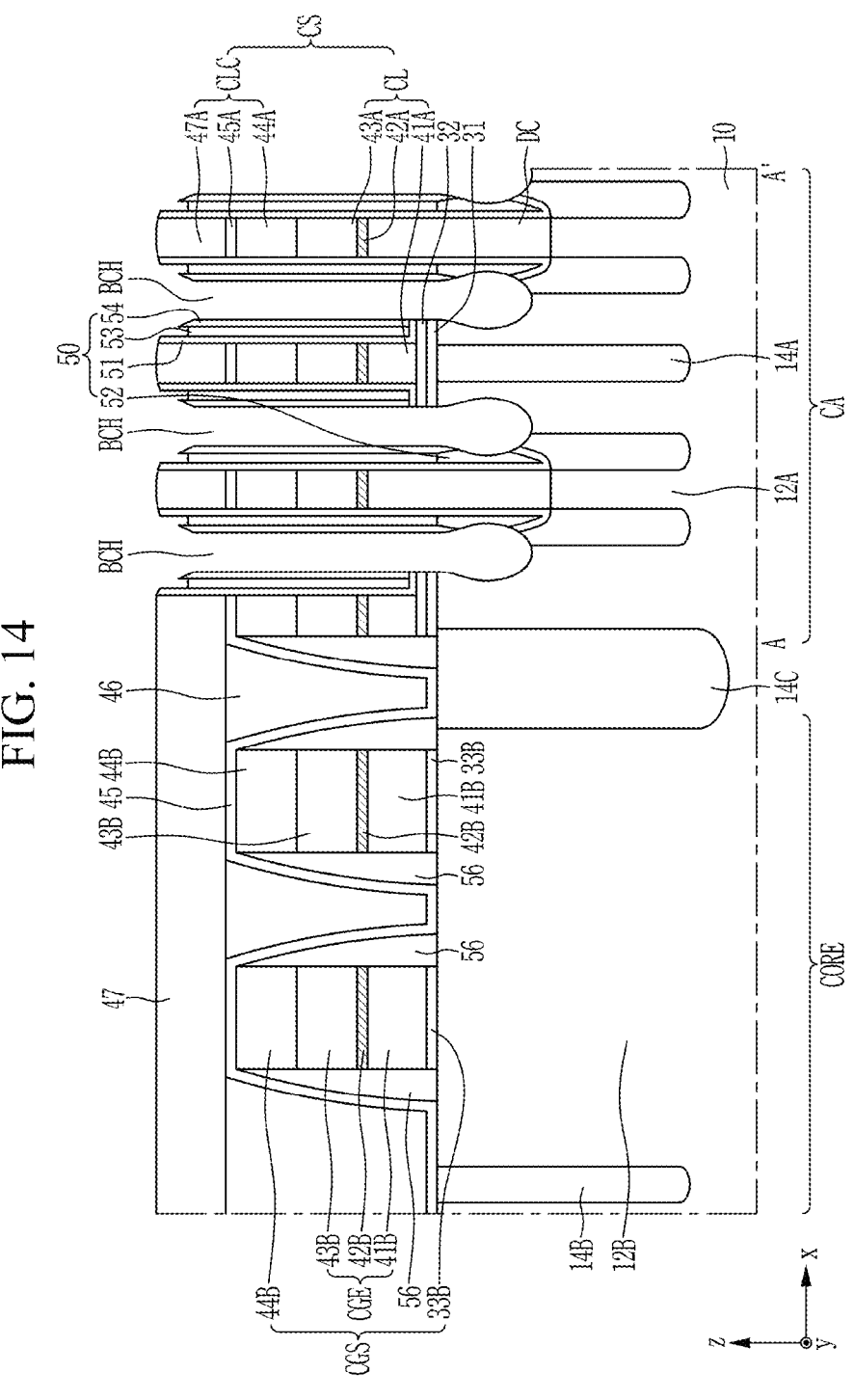

Referring to FIG. 14, a plurality of storage element contact holes BCH for forming the storage element contact BC (see FIG. 1) may be formed by etching the insulating layer 48 for forming the fence in a space between the plurality of cell line structures CS. The active region 12A and the element isolation pattern 14A of the substrate 10 may be exposed through the storage element contact hole BCH. A portion remaining after the insulating layer 48 for forming the fence is etched may serve as a fence 48A (see FIG. 3) separating the storage element contact BC and the landing pad LP manufactured in a subsequent process.

In some example embodiments, a metal silicide film may be formed on the exposed surface of the active region 12A, but the metal silicide film may be omitted. The metal silicide film that may be formed on the exposed surface of the active region 12A may include, for example, cobalt silicide, but is not limited thereto.

Figure 15:
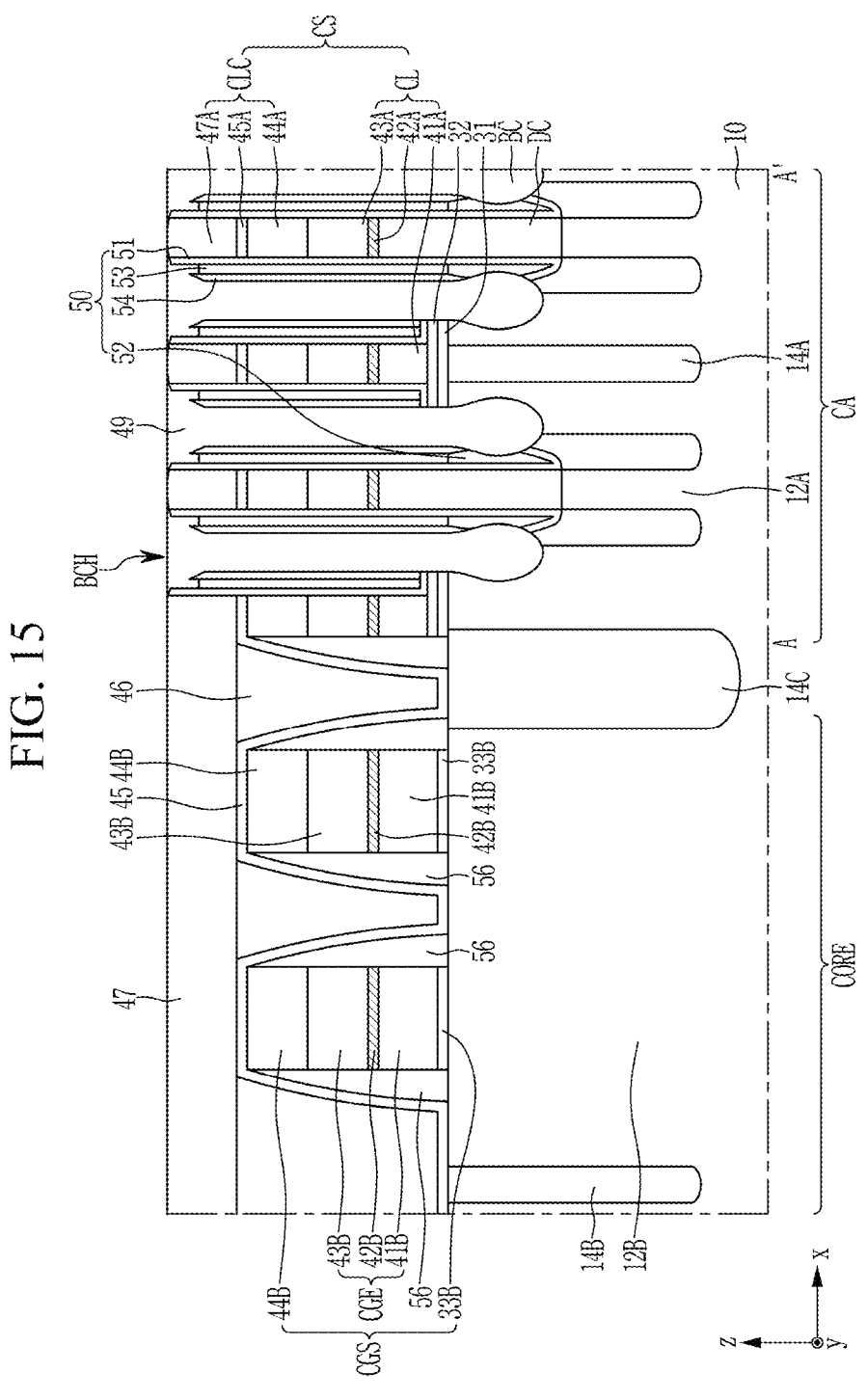

Referring to FIG. 15, a plurality of storage element contacts BC connected to the active region 12A may be formed by filling a fourth conductive layer 49 in the plurality of storage element contact holes BCH.

Specifically, in order to form the storage element contact BC, the storage element contact hole BCH may be filled with the fourth conductive layer 49. The fourth conductive layer 49 may include, for example, at least one of a semiconductor material doped with impurities, a conductive silicide compound, a conductive metal nitride, or a metal. The fourth conductive layer 49 is a semiconductor material doped with impurities, and may include doped polysilicon. The fourth conductive layer 49 may include, for example, polysilicon doped with phosphorus, arsenic, boron, or a combination thereof.

Figure 16:
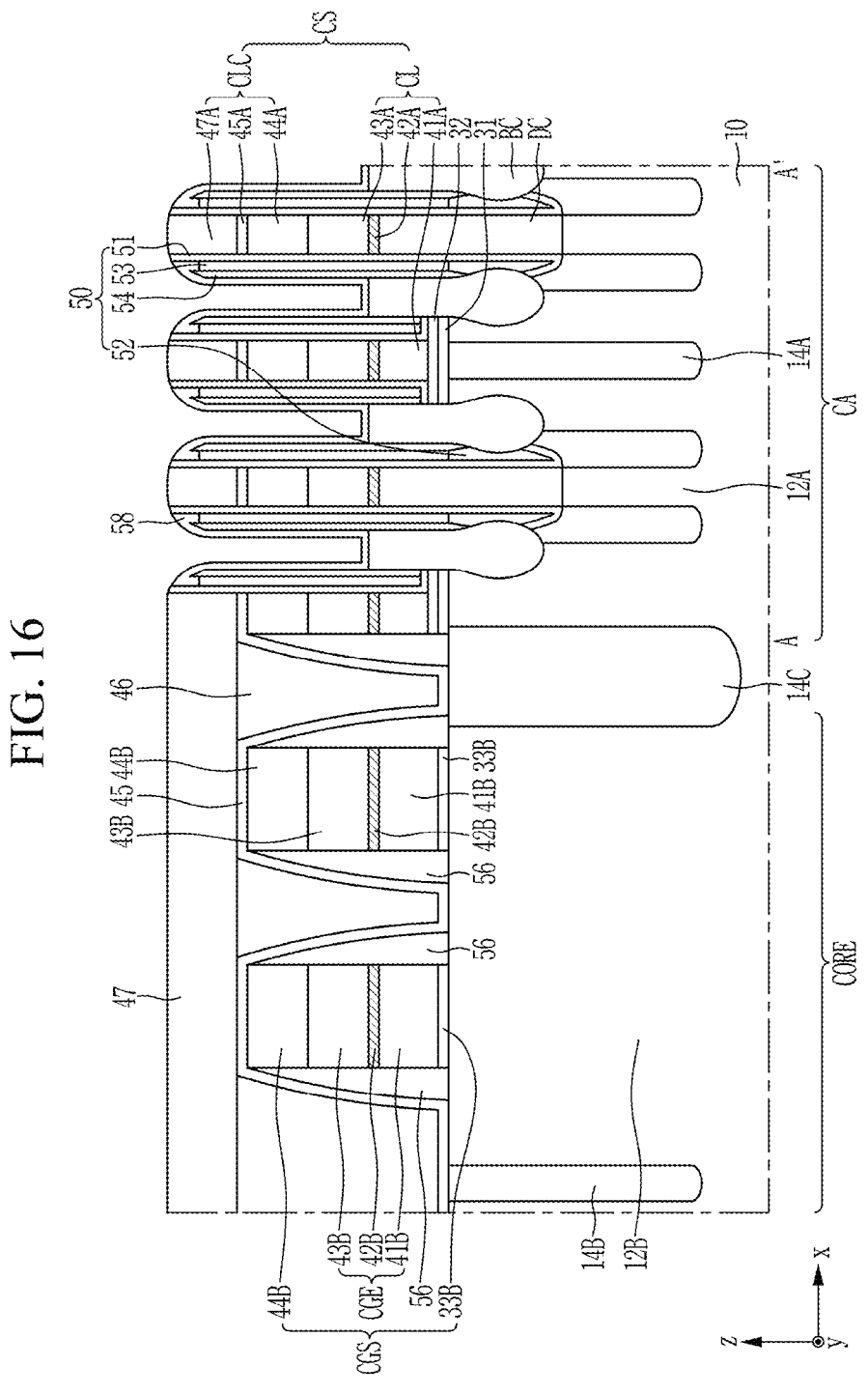

Referring to FIG. 16, the storage element contact BC may be formed by etching the fourth conductive layer 49. Specifically, the etching process of the fourth conductive layer 49 may be performed through an etch-back process, but is not limited thereto.

In the process of forming the storage element contact hole BCH, the cell line structure CS and the cell line spacer 50 may be partially etched. Accordingly, an additional cell spacer 58 may be formed to cover the cell line structure CS and the cell line spacer 50.

Referring to FIG. 16, the cell spacer film (not illustrated) may be formed to cover the all exposed surfaces of the cell line structure CS, the cell line spacer 50, and the storage element contact BC, and the mask layer 47 of the core region CORE. Subsequently, the cell spacer 58 may be formed by removing the cell spacer film (not illustrated) formed on the mask layer 47 of the core region CORE and the cell line structure CS.

According to some example embodiments according to the technical concept of the present inventive concepts, the landing pad LP of the cell array region CA and the contact plug CP of the core region CORE may be simultaneously manufactured. Accordingly, an etching process for lowering the height of the fourth conductive layer 49 constituting the storage element contact BC towards the substrate 10 may be performed to secure a space within the storage element contact hole BCH where the landing pad LP is to be formed.

However, when the height of the fourth conductive layer 49 is lowered before forming the contact plug hole CPH of the core region CORE, that is, when the storage element contact BC is formed by etching the fourth conductive layer 49, a problem arises in that a mask formed through a photolithography process cannot be formed to protect the storage element contact BC. Accordingly, after planarization such that the top surface of the fourth conductive layer 49 is on the same level as (e.g., coplanar with) the top surface of the cell line structure CS, the contact plug hole CPH is formed in the core region CORE in a state in which a mask is formed through a photolithography process to protect the cell array region CA. After the contact plug hole CPH is formed, a process of forming a protective film, such as spin-on-carbon (SOC), to protect the contact plug hole CPH and then selectively exposing the cell array region CA again is needed, and a cumbersome process of performing an etching process for lowering the height of the fourth conductive layer 49 and then removing the protective film, such as the spin-on-carbon (SOC) again, is required. In addition, when this process is performed, as a part of the protective film, such as spin-on-carbon (SOC), protecting the core region CORE is etched in the etching process of the fourth conductive layer 49, by-products of the protective film may be introduced into the storage element contact hole BCH. Accordingly, there may cause a problem in that the top surface of the storage element contact BC is uneven, and the height of the top surface of the storage element contact BC gradually increases as the storage element contact BC is closer to the protective film (that is, closer to the core region CORE).

However, according to some example embodiments according to the technical idea of the present inventive concepts, a process for improving (e.g., reducing) the step difference between the cell array region CA and the core region CORE is performed before (e.g., prior to) forming the contact plug hole CPH in the core region CORE.

Specifically, after the formation of the mask layer 47, the cell line structure CS, the cell line spacer 50, the insulating layer 48 for forming the fence, and the storage element contact hole BCH are formed in the cell array region CA. As a result, the top surface of the core region CORE may be higher than the top surface of the cell array region CA because etch residues and the like are accumulated on the mask layer 47 of the core region CORE. In the drawing, for convenience, the top surfaces of the core region CORE and the cell array region CA are illustrated as being on the same level (e.g., coplanar).

Figure 18:
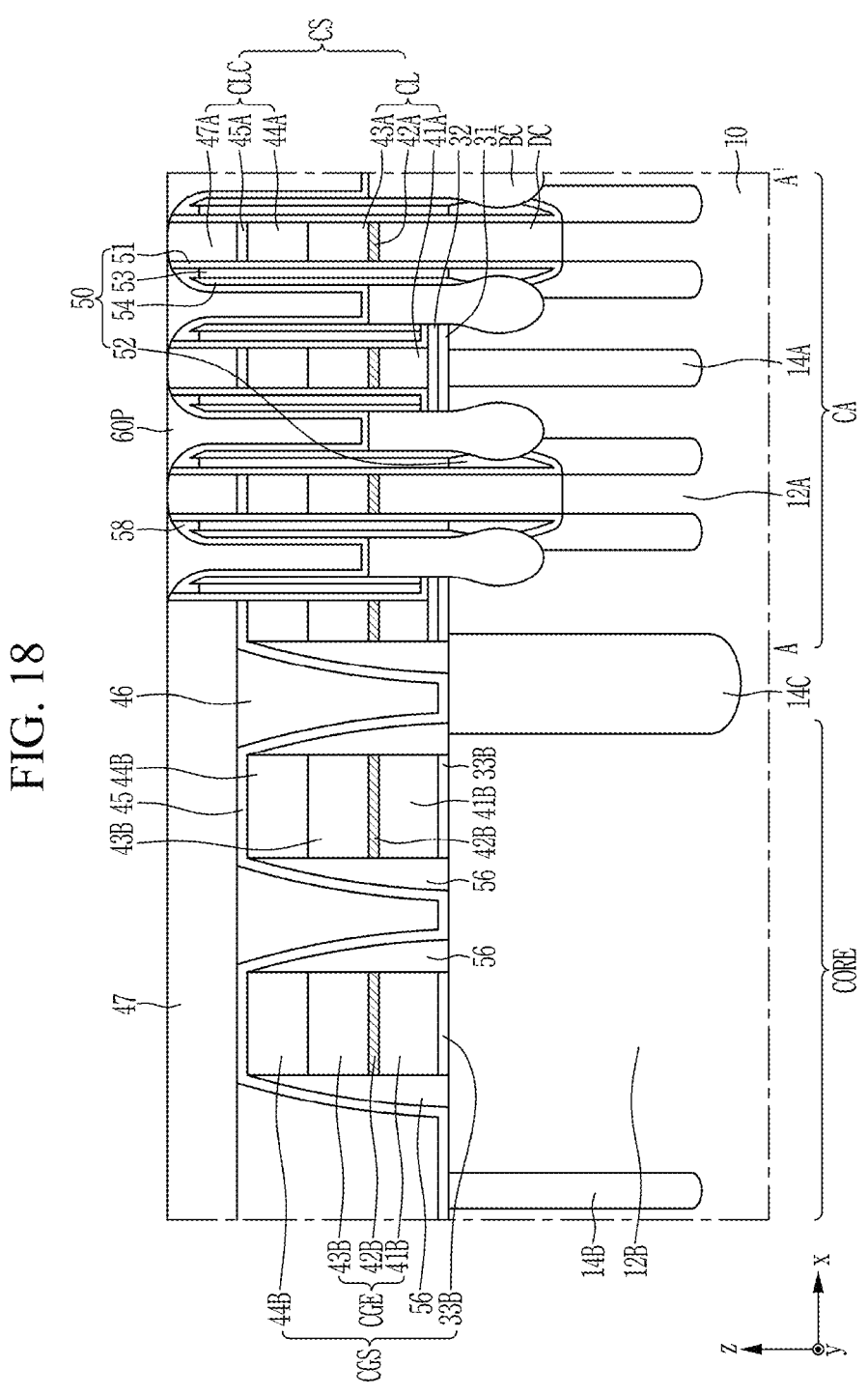

Referring to FIGS. 17 and 18, before forming the contact plug hole CPH in the core region CORE, the height of the fourth conductive layer 49 may be lowered (e.g., lowered towards the substrate 10 in the z direction), the dummy mold layer 60 may be formed to have a thickness sufficient to cover both the upper portion of the cell line structure CS and the top surface of the mask layer 47 while filling the remaining portion of the storage element contact hole BCH (see FIG. 17), and then planarization may be performed until the top surface of the cell line structure CS or the top surface of the insulating layer 48 for forming the fence is exposed (see FIG. 18).

As a result, the top surface of the cell array region CA and the top surface of the core region CORE may lie on the same level. In some example embodiments, the dummy mold layer 60 may be formed of a material different from that of the mask layer 47. As an example, the mask layer 47 may be a silicon nitride film, and the dummy mold layer 60 may be a silicon oxide film formed from the aforementioned TOSZ film, but the present inventive concepts are not limited thereto.

Referring to FIG. 18, the storage element contact BC formed in the cell array region CA may be protected by the dummy mold pattern 60P remaining after the planarization process of the dummy mold layer 60. That is, even though the etching process of lowering the height of the fourth conductive layer 49 to be lower than the upper portion of the cell line structure CS is performed before forming the contact plug hole CPH of the core region CORE, the storage element contact BC may be protected by the dummy mold pattern 60P.

Through the method using such the dummy mold layer 60, the aforementioned two photolithography processes may be omitted. In addition, since a mask, such as spin-on-carbon (SOC), for protecting the contact plug hole CPH of the core region CORE is not used, the top surface of the storage element contact BC may exhibit an even feature (e.g., may be planar along a plane extending parallel to the substrate 10, for example in the x and y directions). As a result, according to some example embodiments according to the technical concept of the present inventive concepts, the top surface of any one first storage element contact BC (e.g., top surface BC_a of BC1 as shown in FIGS. 2, 6, and 7) closest to the core region CORE may have a step difference $\Delta L$ of 5 nm or less with the top surface of any one second storage element contacts BC (e.g., top surface BC_a of any one BC2 as shown in FIGS. 2, 6, and 7) among a plurality of storage element contacts BC first to tenth away from the first storage element contact BC.

In some example embodiments, the top surface of the first storage element contact BC may have a step difference $\Delta L$ of 5 nm or less with the top surface of any one second storage element contact BC among the plurality of storage element contacts BC second to tenth, third to tenth, fourth to tenth, fifth to tenth, sixth to tenth, seventh to tenth, eights to tenth, ninth and tenth, or tenth away from the top surface of the first storage element contact BC. The top surface step difference $\Delta L$ of the first and second storage element contacts BC may be, for example, 5 nm or less, 4 nm or less, 3 nm or less, 2 nm or less, or 1 nm or less.

Figure 19:
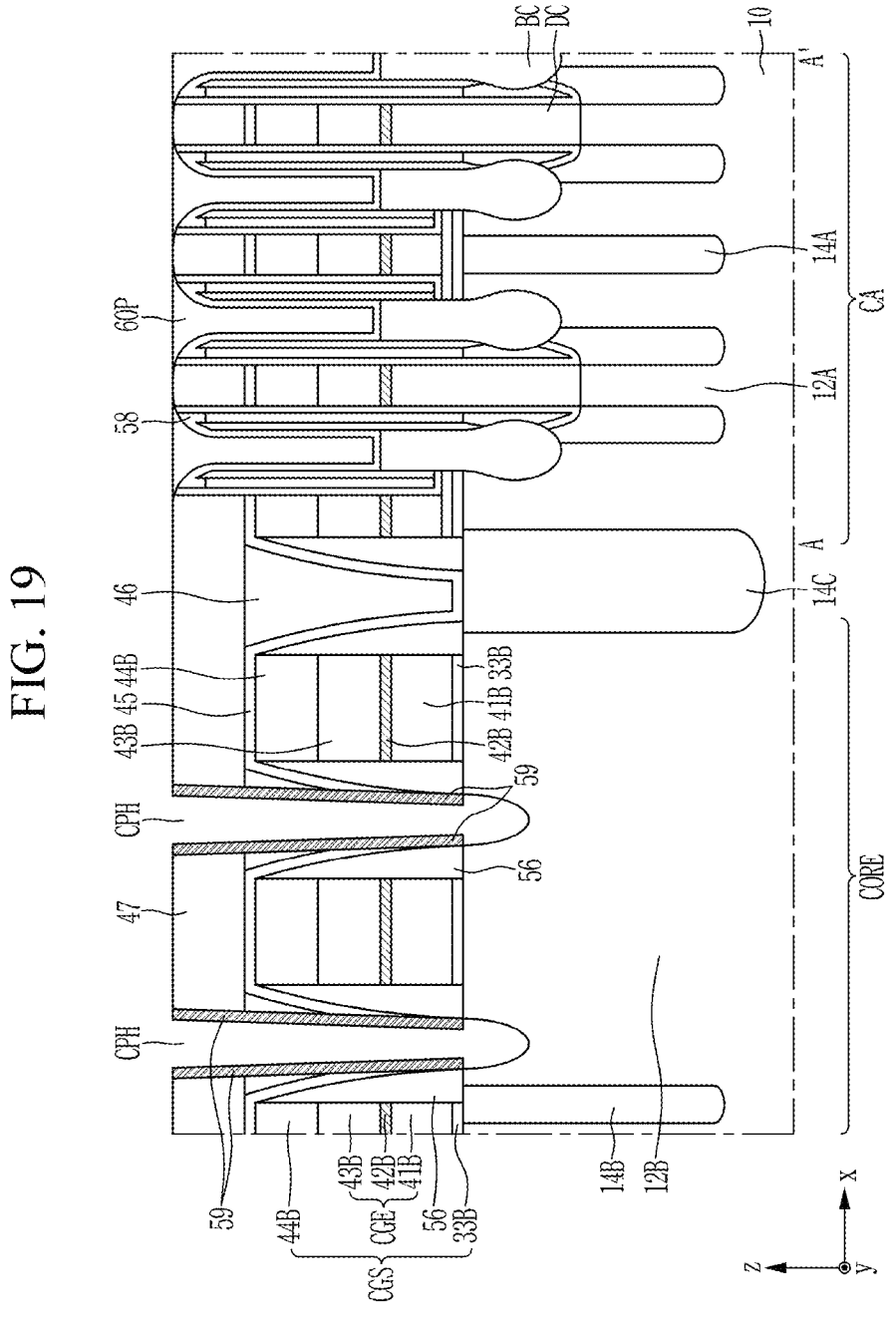

Referring to FIG. 19, in the state where the cell array region CA (e.g., the plurality of storage element contacts BC) is protected by the dummy mold pattern 60P remaining after the planarization process of the dummy mold layer 60, the contact plug hole CPH may be formed in the core region CORE. The contact plug hole CPH may be formed close to the core gate structure CGS. In some example embodiments, the contact plug hole CPH may be formed between the plurality of core gate structures CGS.

Referring to FIG. 19, the core gate spacer 56 may have a shape in which a width measured in a direction perpendicular to a sidewall of the core gate electrode CGE increases as it is closer to the substrate 10. Accordingly, at least a portion of the core gate spacer 56, the insulating liner 45, and the buried insulating layer 46 may overlap in a direction perpendicular to the substrate 10.

In some example embodiments, the contact plug hole CPH may pass through the mask layer 47 and the buried insulating layer 46 to expose the active region 12B of the substrate 10. As a result, the contact plug hole CPH may expose inner walls of the mask layer 47 and the buried insulating layer 46.

In some example embodiments, the contact plug hole CPH passes through the mask layer 47 and the buried insulating layer 46 and passes through a portion of the core gate spacer 56 to expose the active region 12B of the substrate 10. As a result, the contact plug hole CPH may expose inner walls of the mask layer 47, the buried insulating layer 46, and the core gate spacer 56.

As described above, in the process of removing the dummy mold pattern 60P of the cell array region CA after forming the contact plug hole CPH (that is, the process of exposing the upper portion of the storage element contact hole BCH again), as the portions of the buried insulating layer 46 and the core gate spacer 56 exposed by the contact plug hole CPH are etched, there may occur a problem in that the inside of the contact plug hole CPH is widened.

In order to solve the problem, according to some example embodiments according to the technical idea of the present application, the contact plug spacer 59 may be disposed in the contact plug hole CPH. The contact plug spacer 59 may expose a bottom surface of the contact plug hole CPH (e.g., a bottom surface defined by one or more surfaces of the substrate 10) and may be formed only on a sidewall of the contact plug hole CPH (e.g., on exposed inner walls of the mask layer 47, the buried insulating layer 46, the insulating liner 45, and the core gate spacer 56). The contact plug spacer 59 may include, for example, at least one of silicon nitride, silicon oxynitride, silicon carbonitride, and silicon oxycarbonitride.

As illustrated in FIG. 9, when the contact plug spacer 59 is formed, the first width C1 of the contact plug CP may be equal to or greater than the second width C2. The first width C1 of the contact plug CP may be equal to or greater than the third width C3. The first width C1 of the contact plug CP may be equal to or greater than the second width C2, and may be equal to or greater than the third width C3.

Figure 20:
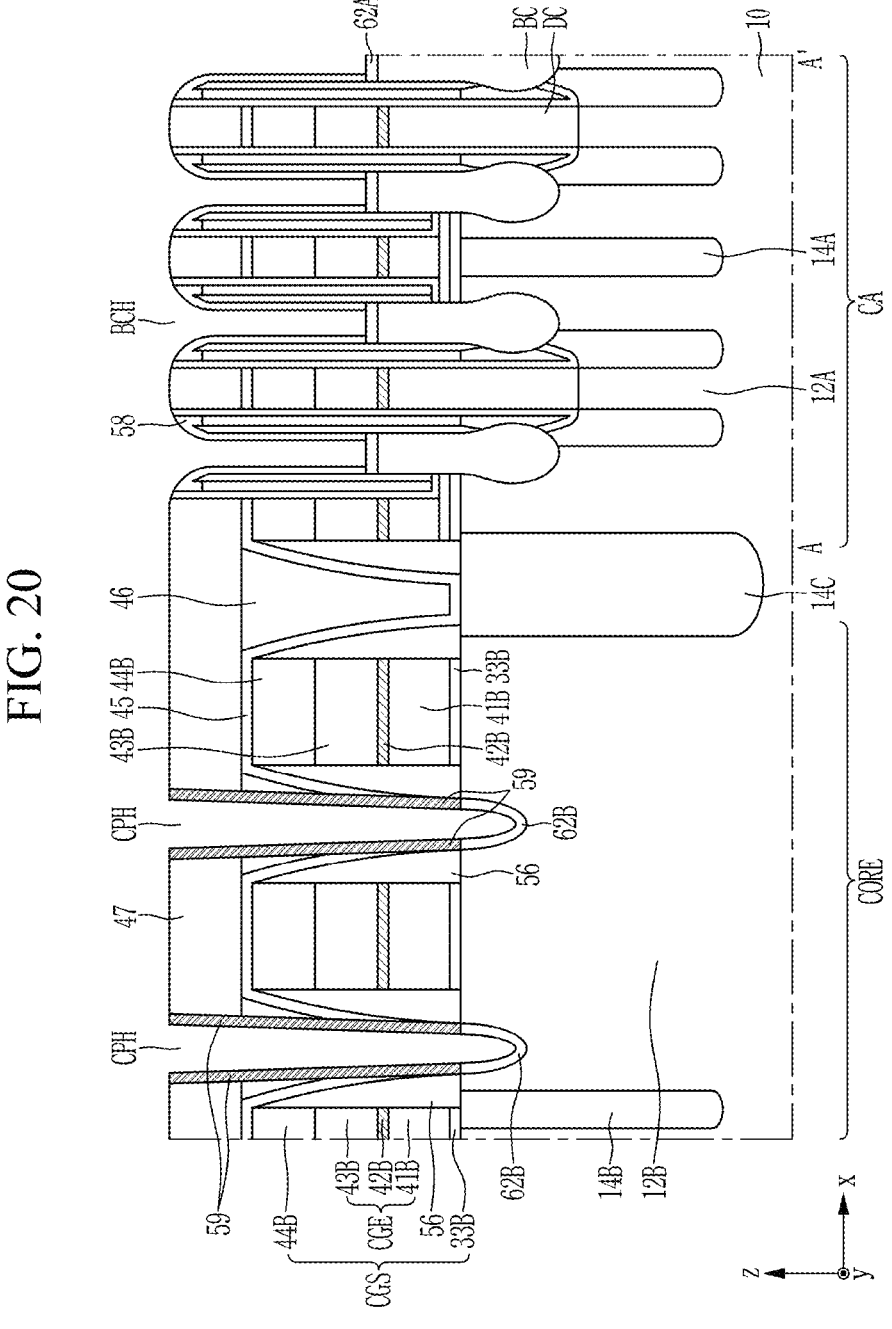

Referring to FIG. 20, after forming the contact plug spacer 59, the dummy mold pattern 60P may be removed by a wet etching process. Then, the exposed bottom surface of the cell spacer 58 may be etched to expose the top surface of the storage element contact BC again.

Subsequently, metal silicide layers 62A and 62B may be simultaneously formed on the top surface of the storage element contact BC and the bottom surface of the contact plug hole CPH.

Specifically, the metal silicide layers 62A and 62B may be formed through a deposition and heat treatment process of a silicide-metal layer. The metal silicide layers 62A and 62B may be formed by using a metal (for example, cobalt, titanium, and nickel) capable of forming silicide by reacting with silicon. In some example embodiments, the metal silicide layers 62A and 62B may include cobalt silicide.

Figure 21:
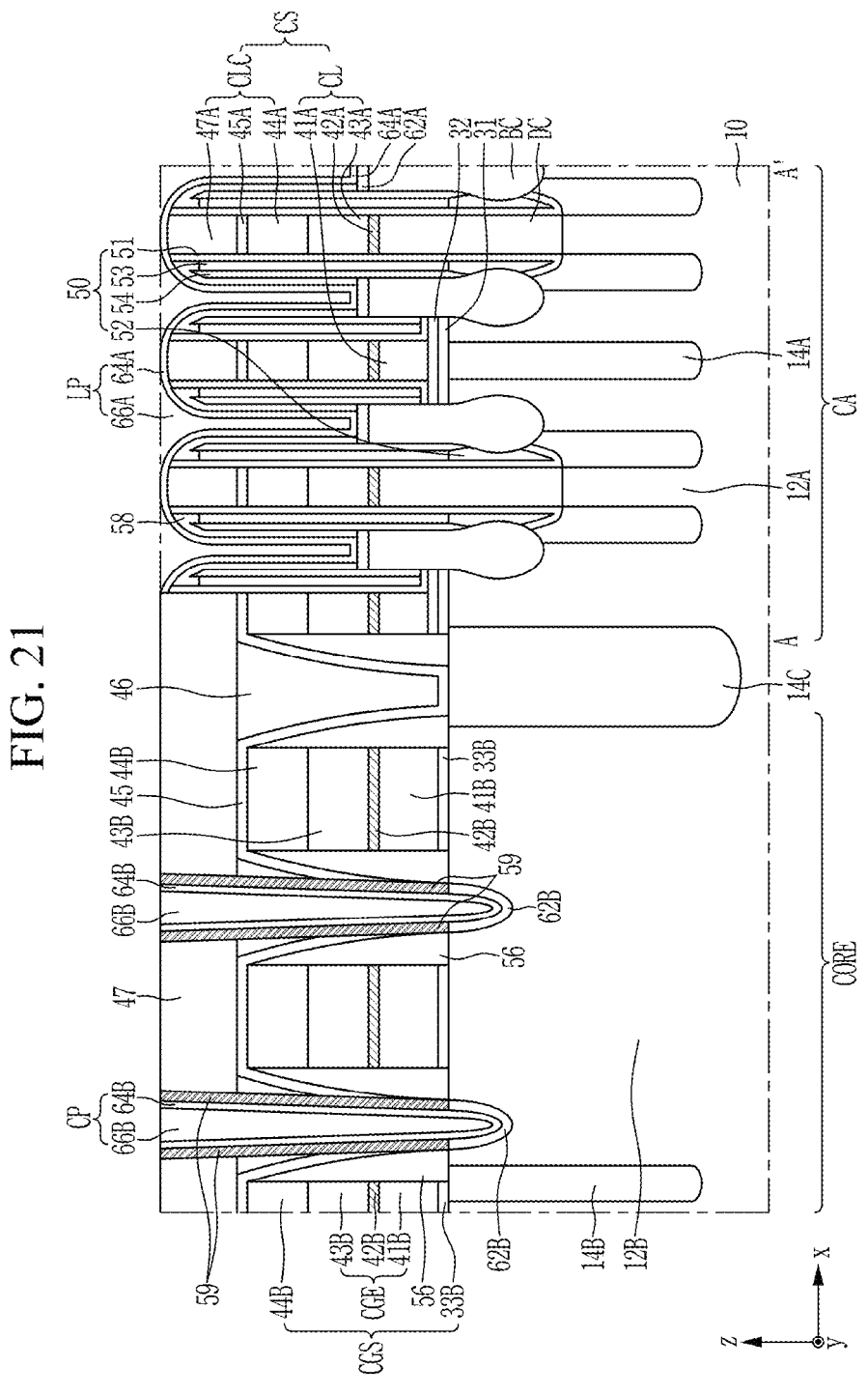

Referring to FIG. 21, a conductive barrier layer (not illustrated) and a fifth conductive layer (not illustrated) may be formed in the storage element contact hole BCH and contact plug hole CPH.

In some example embodiments, the conductive barrier layer (not illustrated) may have, for example, Ti, TiN, or a stacked structure of Ti/TiN. The fifth conductive layer (not illustrated) may include, for example, at least one of a semiconductor material doped with impurities, a conductive silicide compound, a conductive metal nitride, a conductive metal carbide, a metal, or a metal alloy.

Thereafter, according to some example embodiments, the conductive barrier film (not illustrated) and the fifth conductive layer (not illustrated) are etched to expose the mask layer 47 in the core region CORE, thereby forming the second conductive barrier pattern 64B and the eighth conductive pattern 66B. The second conductive barrier pattern 64B and the eighth conductive pattern 66B may constitute a contact plug CP.

In some example embodiments, a wire (not illustrated) may be formed on the contact plug CP.

Meanwhile, the first conductive barrier pattern 64A and the seventh conductive pattern 66A may be formed by etching the conductive barrier film (not illustrated) and the fifth conductive layer (not illustrated) to obtain a landing pad LP having a desired shape in the cell array region CA.

Referring to FIG. 2, in the cell array region CA, the fifth conductive layer (not illustrated) may be planarized so that the fifth conductive layer (not illustrated) partially overlaps the cell line structure CS in the third direction (z direction). Thereafter, the fifth conductive layer (not illustrated) extending in the first direction (x direction) may be etched to be spaced apart in the first direction (x direction). In this case, the fifth conductive layer (not illustrated) may be etched so that each of the seventh conductive patterns 66A formed by etching the fifth conductive layer (not illustrated) may be connected to each storage element contact BC.

Portions of the cell line structure CS, the cell line spacer 50, the cell spacer 58, and the conductive barrier film (not illustrated) may be etched while the fifth conductive layer (not illustrated) is etched. In some example embodiments, the third spacer 53 of the cell line spacer 50 may be exposed during the etching process. The material of the exposed third spacer 53 may be removed through an additional etching process to form an air gap in the position of the third spacer 53. The air gap may have a line shape parallel to both sidewalls of the cell line structure CS. That is, an air gap may exist between the first spacer 51 and the fourth spacer 54. Thereafter, an air capping layer (not illustrated) may be formed on the air gap to seal the air gap.

A pad isolation insulating layer 70 may be formed in a hole formed by etching the fifth conductive layer (not illustrated). Referring to FIGS. 2 and 3, the pad isolation insulating layer 70 may be positioned between neighboring landing pads LP.

An electrode (not illustrated) of a storage element may be formed on the landing pad LP. The storage element may include a capacitor.

Figure 22:
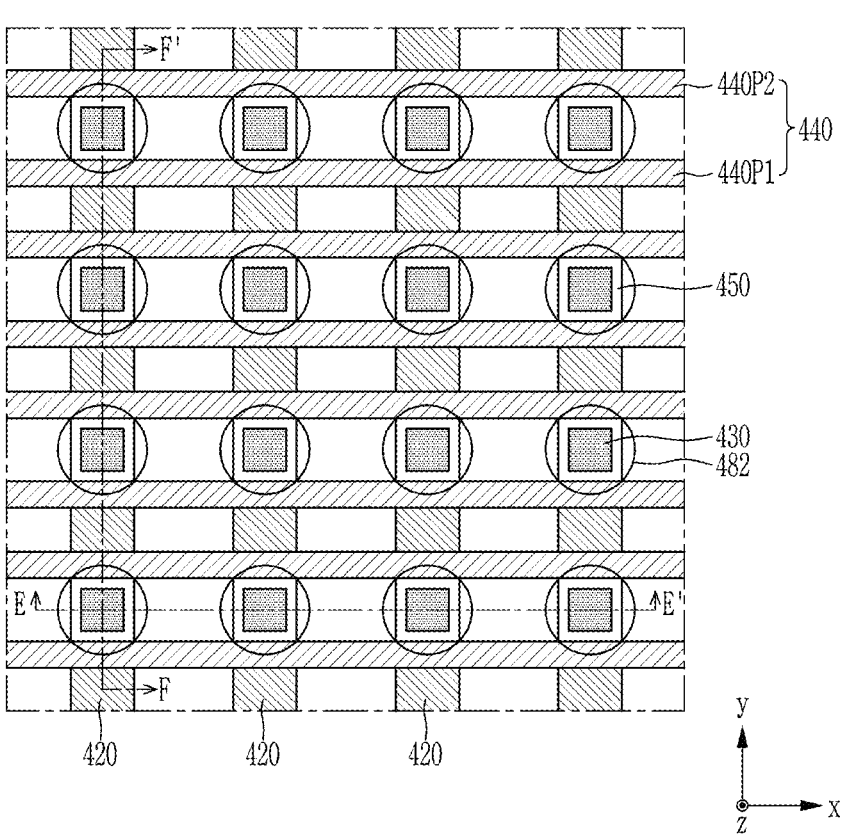
FIG. 22 is a top plan view illustrating a semiconductor device according to some example embodiments.
Figure 23:
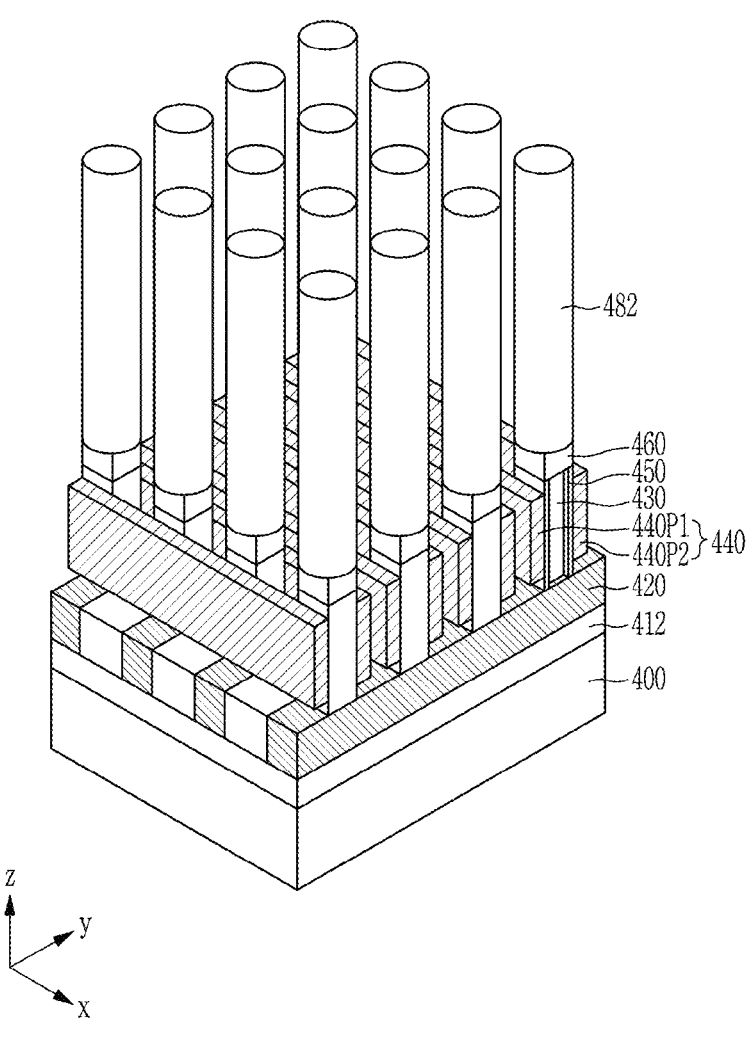
FIG. 23 is a perspective view illustrating the semiconductor device according to some example embodiments.
Figure 24:
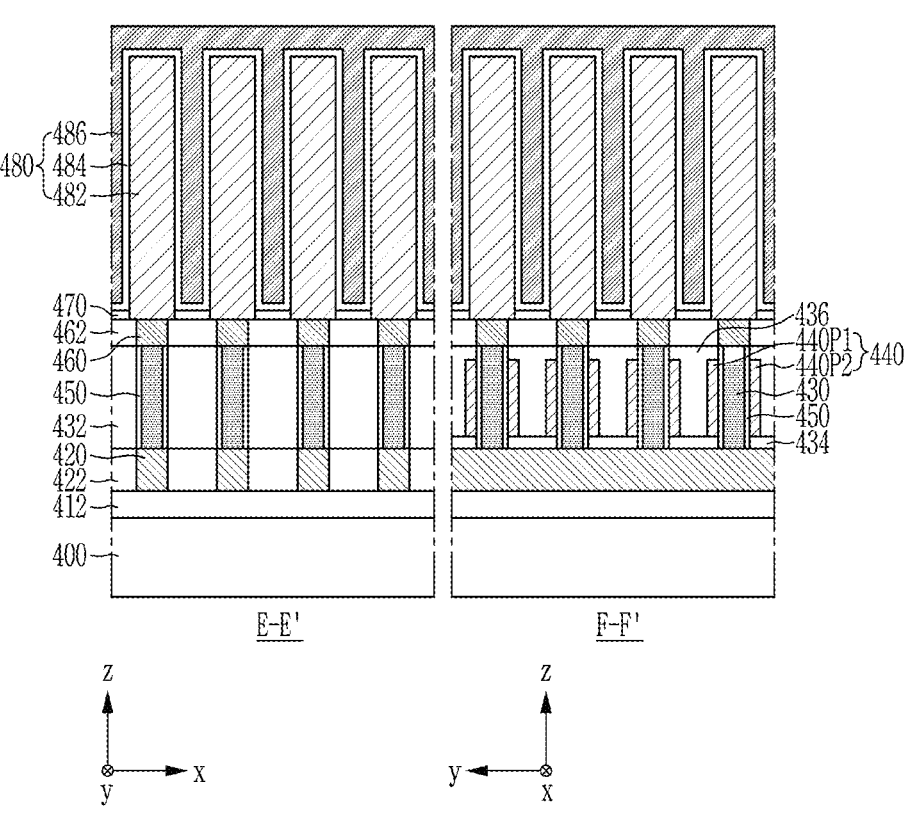
FIG. 24 is a cross-sectional view taken along lines E-E' and F-F' of FIG. 22.

FIG. 22 is a top plan view for describing a semiconductor device according to some example embodiments. FIG. 23 is a perspective view for describing a semiconductor device according to some example embodiments. FIG. 24 is a cross-sectional view taken along lines E-E' and F-F' of FIG. 22.

Referring to FIGS. 22 to 24, a semiconductor device according to some example embodiments may include a substrate 400, a plurality of first conductive lines 420, a channel layer 430, a gate electrode 440, and a gate insulating film 450. and a capacitor 480. The semiconductor device according to some example embodiments may be a semiconductor device including a vertical channel transistor (VCT). The vertical channel transistor may refer to a structure in which a channel length of the channel layer 430 extends from the substrate 400 in a vertical direction.

A lower insulating layer 412 may be disposed on the substrate 400. The plurality of first conductive lines 420 on the lower insulating layer 412 may be spaced apart from each other in a first direction (x direction) and extend in a second direction (y direction). A plurality of first insulating patterns 422 may be disposed on the lower insulating layer 412 to fill spaces between the plurality of first conductive lines 420. The plurality of first insulating patterns 422 may extend in the second direction (y direction). Top surfaces of the plurality of first insulating patterns 422 may be disposed at the same level as top surfaces of the plurality of first conductive lines 420. The plurality of first conductive lines 420 may function as bit lines.

The plurality of first conductive lines 420 may include a doped semiconductor material, a metal, a conductive metal nitride, a conductive metal silicide, a conductive metal oxide, or a combination thereof. For example, the plurality of first conductive lines 420 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not limited thereto. The plurality of first conductive lines 420 may include a single layer or multiple layers of the aforementioned materials. In some example embodiments, the plurality of first conductive lines 420 may include graphene, carbon nanotubes, or a combination thereof.

The channel layer 430 may be arranged in a matrix form spaced apart from each other in the first direction (x direction) and the second direction (y direction) on the plurality of first conductive lines 420. The channel layer 430 may have a fourth width along the first direction (x direction) and a first height along a third direction (z direction), and the first height may be greater than the fourth width. Here, the third direction (z direction) intersects the first direction (x direction) and the second direction (y direction), and may be may be, for example, a direction perpendicular to the top surface of the substrate 400. For example, the first height may be about 2 to 10 times the fourth width, but is not limited thereto. An upper portion and a bottom portion of the channel layer 430 each function as a source/drain region (not illustrated), and a portion of the channel layer 430 between the source/drain region functions as a channel region (not illustrated).

In some example embodiments, the channel layer 430 may include an oxide semiconductor, for example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O, or a combination thereof. The channel layer 430 may include a single layer or multiple layers of the oxide semiconductor. In some examples, the channel layer 430 may have band gap energy greater than band gap energy of silicon. For example, the channel layer 430 may have band gap energy of about 1.5 eV to about 5.6 eV. For example, the channel layer 430 may have optimal channel performance when the channel layer 430 has band gap energy of about 2.0 eV to about 4.0 eV.

For example, the channel layer 430 may be polycrystalline or amorphous, but is not limited thereto. In some example embodiments, the channel layer 430 may include graphene, carbon nanotubes, or a combination thereof.

The gate electrode 440 may extend in the first direction (x direction) on both sidewalls of the channel layer 430. The gate electrode 440 includes a first sub-gate electrode 440P1 facing a first sidewall of the channel layer 430 and a second sub-gate electrode 440P2 facing a second sidewall opposite the first sidewall of the channel layer 430. As one channel layer 430 is disposed between the first sub-gate electrode 440P1 and the second sub-gate electrode 440P2, the semiconductor device may have a dual-gate transistor structure. However, the technical idea of the present inventive concepts are not limited thereto, and the second sub-gate electrode 440P2 is omitted and only the first sub-gate electrode 440P1 facing the first sidewall of the channel layer 430 is formed, thereby implementing a single gate transistor structure. A material included in the gate electrode 440 may be the same as that of the cell gate electrode 24.

The gate insulating film 450 surrounds the sidewall of the channel layer 430 and may be interposed between the channel layer 430 and the gate electrode 440. For example, as illustrated in FIG. 22, the entire sidewall of the channel layer 430 may be surrounded by the gate insulating film 450, and a portion of the sidewall of the gate electrode 440 may contact the gate insulating film 450. In other embodiments, the gate insulating film 450 may extend in the extension direction of the gate electrode 440 (that is, the first direction (x direction)), and only two side walls facing the gate electrode 440 among the side walls of the channel layer 430 may contact the gate insulating film 450. In some example embodiments, the gate insulating film 450 may be formed of a silicon oxide film, a silicon oxynitride film, a high dielectric constant material having a higher dielectric constant than that of the silicon oxide film, or a combination thereof.

A plurality of second insulating patterns 432 may extend along the second direction (y direction) on the plurality of first insulating patterns 422. A channel layer 430 may be disposed between two adjacent second insulating patterns 432 among the plurality of second insulating patterns 432. In addition, a first buried layer 434 and a second buried layer 436 may be disposed in a space between two adjacent channel layers 430 between two adjacent second insulating patterns 432. The first buried layer 434 may be disposed on a bottom portion of a space between two adjacent channel layers 430. The second buried layer 436 may be formed to fill the remaining space between two adjacent channel layers 430 on the first buried layer 434. A top surface of the second buried layer 436 is disposed at the same level as a top surface of the channel layer 430, and the second buried layer 436 may cover a top surface of the second gate electrode 440. Alternatively, the plurality of second insulating patterns 432 may be formed as a material layer continuous with the plurality of first insulating patterns 422, or the second buried layer 436 may be formed as a material layer continuous with the first buried layer 434.

A storage element contact 460 may be disposed on the channel layer 430. The storage element contacts 460 may be arranged to vertically overlap the channel layer 430 and may be arranged in a matrix form spaced apart from each other in the first direction (x direction) and the second direction (y direction). For example, the storage element contact 460 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. The upper insulating layer 462 may surround sidewalls of the storage element contact 460 on the plurality of second insulating patterns 432 and the second buried layer 436.

According to some example embodiments, in the manufacturing operation of the storage element contact 460, a process for improving a step difference occurring at a top surface boundary between the cell array region CA and the core region CORE, which is performed in the above-described method of manufacturing the semiconductor device in which the word line WL is buried, may be performed.

Specifically, after forming a storage element contact hole (corresponding to BCH in FIG. 14) in the upper insulating layer 462, a dummy mold layer (corresponding to reference numeral 60 in FIG. 17) may be formed to a thickness sufficient to cover the entire top surface of the core region CORE while filling the storage element contact hole (corresponding to BCH in FIG. 14). Thereafter, the dummy mold layer (corresponding to reference numeral 60 in FIG. 17) is planarized (corresponding to the process in FIG. 18) until the top surface of the upper insulating layer 462 is exposed, so that the top surface of the cell array region CA and the top surface of the core region CORE may be on the same level (e.g., coplanar).

Further, in a state where the storage element contact hole (corresponding to BCH in FIG. 14) formed in the upper insulating layer 462 is protected with the dummy mold pattern (corresponding to 60P in FIG. 19), a contact plug hole CPH may be formed in the core region CORE, and a contact plug spacer 59 may be formed in the contact plug hole CPH. Accordingly, in the process of removing the dummy mold pattern 60P of the cell array region CA, the problem of widening the inside of the contact plug hole CPH may be solved. That is, even in a semiconductor device including a VCT, as illustrated in FIG. 9, the first width C1 of the contact plug CP may be equal to or greater than the second width C2. The first width C1 of the contact plug CP may be equal to or greater than the third width C3. The first width C1 of the contact plug CP may be equal to or greater than the second width C2, and may be equal to or greater than the third width C3.

In addition, since the storage element contact 460 is formed in a state where the contact plug hole CPH is protected by the contact plug spacer 59, a protective film, such as spin-on-carbon (SOC), protecting the core region CORE is unnecessary. Accordingly, even in the semiconductor device including the VCT, the top surface of the storage element contact 460 may exhibit a uniform characteristic (e.g., may be planar in a plane that is parallel to the substrate 400, including a top surface and/or a bottom surface of the substrate 400). As a result, according to some example embodiments according to the technical concept of the present inventive concepts, the top surface of any one first storage element contact 460 closest to the core region CORE may have a step difference ΔL of 5 nm or less with the top surface of any one second storage element contacts 460 among a plurality of storage element contacts 460 first to tenth away from the first storage element contact 460.

In some example embodiments, the top surface of the first storage element contact 460 may have a step difference ΔL of 5 nm or less with the top surface of any one second storage element contact 460 among the plurality of storage element contacts 460 second to tenth, third to tenth, fourth to tenth, fifth to tenth, sixth to tenth, seventh to tenth, eights to tenth, ninth and tenth, or tenth away from the top surface of the first storage element contact 460. The top surface step difference ΔL of the first and second storage element contacts 460 may be, for example, 5 nm or less, 4 nm or less, 3 nm or less, 2 nm or less, or 1 nm or less.

A cell etch stop layer 470 may be disposed on the upper insulating layer 462. The capacitor 480 may be disposed on the cell etch stop layer 470.

The capacitor 480 may include a lower electrode 482, a capacitor dielectric film 484, and an upper electrode 486. The lower electrode 482 may pass through the cell etch stop layer 470 and be electrically connected to a top surface of the storage element contact 460.

The lower electrode 482 may be formed in a pillar type extending in the third direction (z direction), but is not limited thereto. In some example embodiments, the lower electrode 482 is arranged to vertically overlap the storage element contact 460 and is arranged in a matrix form spaced apart from each other in the first direction (x direction) and the second direction (y direction). Alternatively, a landing pad (not illustrated) may be further disposed between the storage element contact 460 and the lower electrode 482 so that the lower electrode 482 may be arranged in a hexagonal shape.

Figure 25:
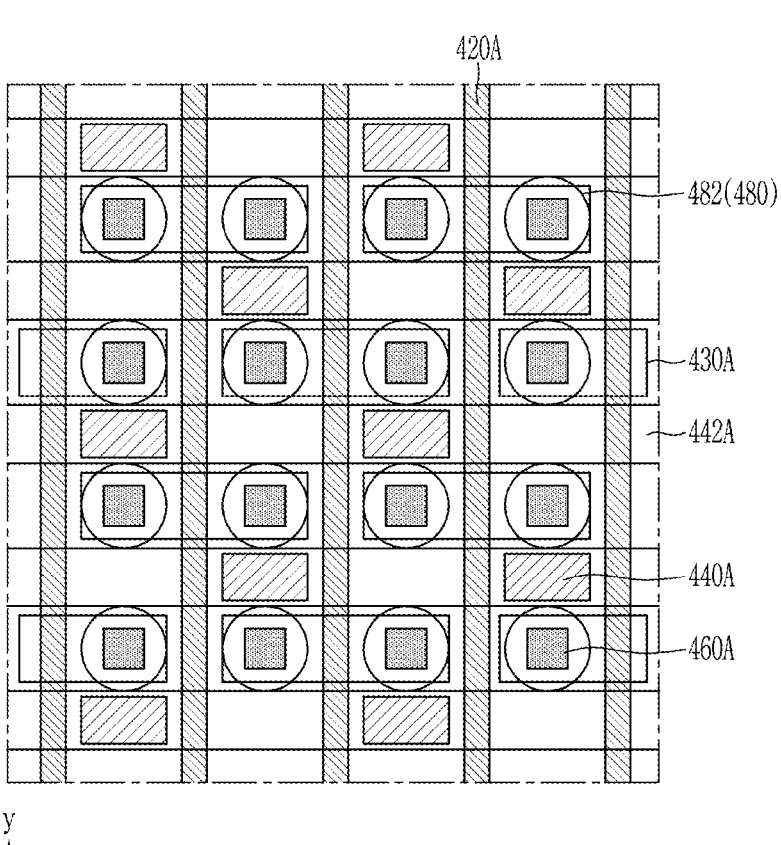
FIG. 25 is a top plan view illustrating a semiconductor device according to some example embodiments.
Figure 25:
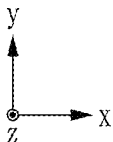
Figure 26:
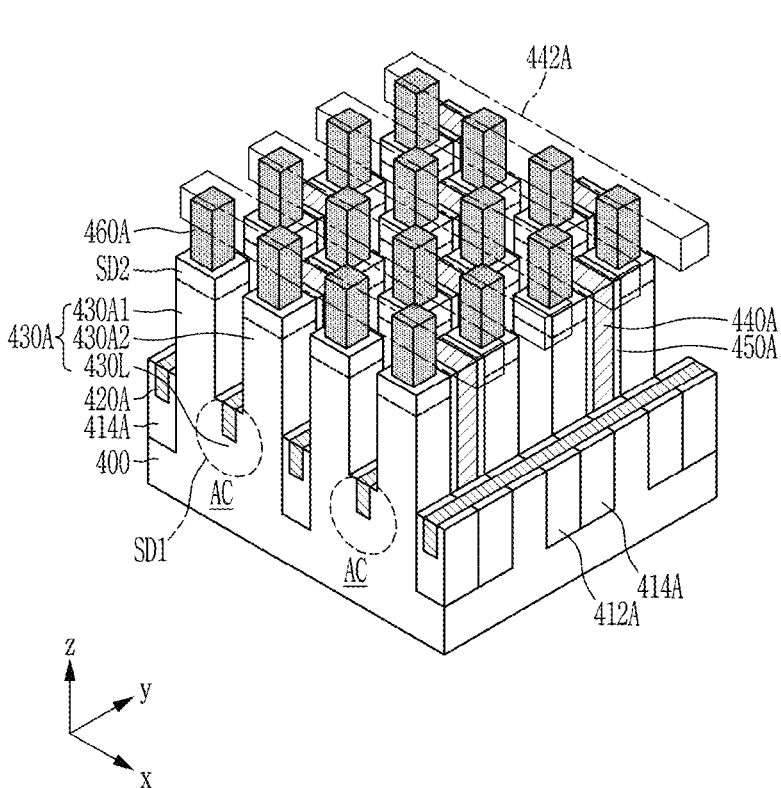
FIG. 26 is a perspective view illustrating a semiconductor device according to some example embodiments.

FIG. 25 is a top plan view for describing a semiconductor device according to some example embodiments. FIG. 26 is a perspective view for describing a semiconductor device according to some example embodiments.

Referring to FIGS. 25 and 26, a semiconductor device according to some example embodiments may include a substrate 400, a plurality of first conductive lines 420A, a channel structure 430A, a contact gate electrode 440A, a plurality of second conductive lines 442A, and a capacitor 480. The semiconductor device according to some example embodiments may be a semiconductor device including a vertical channel transistor (VCT).

A plurality of active regions AC may be defined on the substrate 400 by a first element isolation pattern 412A and a second element isolation pattern 414A. The channel structure 430A may be disposed in each active region AC. The channel structure 430A may include a first active pillar 430A1 and a second active pillar 430A2 extending in a vertical direction, and a connection part 430L connected to a bottom portion of the first active pillar 430A1 and a bottom portion of the second active pillar 430A2. A first source/drain region SD1 may be disposed in the connection part 430L. A second source/drain region SD2 may be disposed above the first and second active pillars 430A1 and 430A2. The first active pillar 430A1 and the second active pillar 430A2 may constitute independent unit memory cells.

The plurality of first conductive lines 420A may extend in a second direction (y direction) crossing each of the plurality of active regions AC. One first conductive line 420A among the plurality of first conductive lines 420A may be disposed on the connection part 430L between the first active pillar 430A1 and the second active pillar 430A2. One first conductive line 420A may be disposed on the first source/drain region SD1. Another first conductive line 420A adjacent to one first conductive line 420A may be disposed between the two channel structures 430A. Among the plurality of first conductive lines 420A, one first conductive line 420A may serve as a common bit line included in the two unit memory cells constituted by the first active pillar 430A1 and the second active pillar 430A2 disposed on both sides of the one first conductive line 420A.

One contact gate electrode 440A may be disposed between two channel structures 430A adjacent in the second direction (y direction).

For example, a contact gate electrode 440A may be disposed between the first active pillar 430A1 included in one channel structure 430A and a second active pillar 430A2 of the channel structure 430A adjacent thereto. One contact gate electrode 440A may be shared by the first active pillar 430A1 and the second active pillar 430A2 disposed on both sidewalls thereof. A gate insulating film 450A may be disposed between the contact gate electrode 440A and the first active pillar 430A1 and between the contact gate electrode 440A and the second active pillar 430A2. The plurality of second conductive lines 442A may extend in the first direction (x direction) on the top surface of the contact gate electrode 440A. The plurality of second conductive lines 442A may function as word lines of the semiconductor device.

A storage element contact 460A may be disposed on the channel structure 430A. The storage element contact 460A may be disposed on the second source/drain region SD2, and the capacitor 480 may be disposed on the storage element contact 460A.

Figure 27:
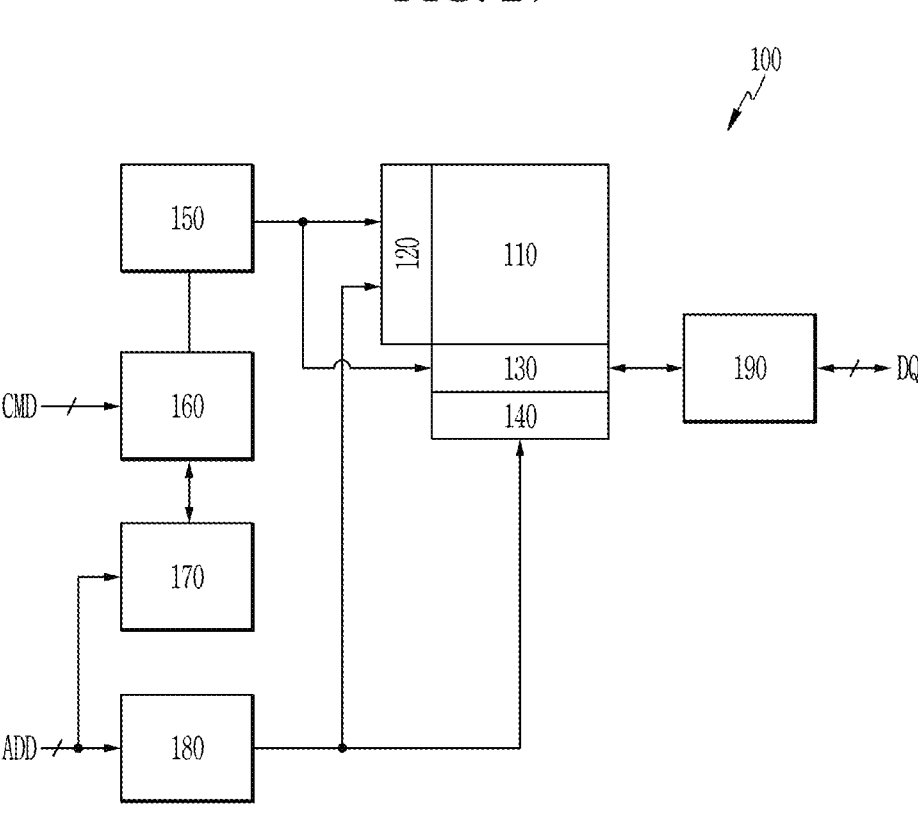
FIG. 27 is a block diagram illustrating a semiconductor device according to some example embodiments.

FIG. 27 is a block diagram illustrating a semiconductor device 100 according to some example embodiments.

Referring to FIG. 27, the semiconductor device 100 may include a memory cell array 110, a row decoder 120, a sense amplifier 130, a column decoder 140, a self-refresh control circuit 150, a command decoder 160, a Mode Register Set/Extended Mode Register Set (MRS/EMRS) circuit 170, an address buffer 180, and a data input/output circuit 190.

A plurality of memory cells for storing data may be arranged in a row direction and a column direction in the memory cell array 110. Each of the plurality of memory cells may include a cell capacitor and an access transistor. A gate of the access transistor may be connected to a corresponding word line among a plurality of word lines arranged in the row direction, one of the source and the drain may be connected to a bit line or a complementary bit line (/BL) arranged in the column direction, and the other of the source and the drain may be connected to the cell capacitor.

The sense amplifier 130 may sense and amplify data of a memory cell and store the data in the memory cell. The sense amplifier 130 may be implemented as a cross-coupled amplifier connected between the bit line BL and the complementary bit line /BL.

Data DQ input through the data input/output circuit 190 may be written into the memory cell array 110 based on an address signal ADD, and the data DQ read from the memory cell array 110 based on the address signal ADD may be output to the outside through the data input/output circuit 190. The address signal ADD may be input to the address buffer 180 to designate a memory cell in or from which data is to be written or read. The address buffer 180 may temporarily store the address signal ADD input from the outside.

The row decoder 120 may decode a row address among the address signals ADD output from the address buffer 180 to designate a word line connected to a memory cell to or from which data is to be input or output. That is, the row decoder 120 may decode the row address output from the address buffer 180 in the data write or read mode to enable a corresponding word line. Also, in the self-refresh mode, the row decoder 120 may decode a row address generated from an address counter to enable a corresponding word line.

The column decoder 140 may decode a column address among address signals ADD output from the address buffer 180 to designate a bit line connected to a memory cell to or from which data is to be input or output.

The memory cell array 110 may output data from the memory cell designated by the row and column addresses or write data into the memory cell.

The command decoder 160 may receive a command signal CMD applied from the outside, decode the signals, and internally generate a decoded command signal, for example, a self-refresh entry command or a self-refresh exist command.

The MRS/EMRS circuit 170 may set an internal mode register in response to an MRS/EMRS command for designating an operation mode of the semiconductor device 100 and an address signal ADD.

Also, although not illustrated in FIG. 27, the semiconductor device 100 may further include a clock circuit for generating a clock signal, a power circuit for generating or distributing an internal voltage by receiving a power voltage applied from the outside, and the like.

The self-refresh control circuit 150 may control a self-refresh operation of the semiconductor device 100 in response to a command output from the command decoder 160.

The command decoder 160 may include an address counter, a timer, and a core voltage generator. The address counter may generate a row address for designating a row address to be subjected to self-refresh in response to the self-refresh entry command output from the command decoder 160 and apply the generated row address to the row decoder 120. The address counter may stop a counting operation in response to a self-refresh exit command output from the command decoder 160.

The memory cell array 110 and the sense amplifier 130 may constitute a memory core unit.

Figure 28:
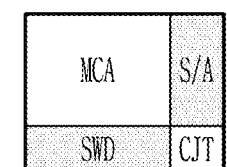
FIG. 28 is a diagram illustrating a layout of a memory core unit including a memory cell array and a sense amplifier illustrated in FIG. 27.

FIG. 28 is a diagram illustrating a layout of a memory core unit 132 including the memory cell array 110 and the sense amplifier 130 illustrated in FIG. 27.

Referring to FIG. 28, the memory core unit 132 may include a plurality of memory cell array blocks MCA. The memory cell array block MCA may constitute the memory cell array 110 of FIG. 27.

A plurality of sub-word line driver blocks SWD may be arranged in the word line direction of the memory cell array block MCA, and a plurality of sense amplifier blocks S/A may be arranged in the bit line direction. A plurality of bit line sense amplifiers may be arranged in the sense amplifier block S/A.

A conjunction block CJT may be arranged at a point where the sub word line driver block SWD and the sense amplifier block S/A intersect. Power drivers and ground drivers for driving the bit line sense amplifiers may be alternately arranged in the conjunction block CJT.

In some example embodiments, the cell array region CA of FIGS. 2 to 5 may be a part of the memory cell array block MCA of FIG. 28. Further, the core region CORE of FIGS. 2, 4, and 5 may be a part of the sense amplifier block S/A of FIG. 28, a part of the word line driver block SWD, or a part of the row decoder 120 and/or a part of the column decoder 140 of FIG. 27, but is not limited to thereto.

FIGS. 27 and 28 merely illustrate the semiconductor device according to some example embodiments of the present inventive concepts, but the structure of the semiconductor device of the present inventive concepts is not limited to the structure shown in FIGS. 27 and 28.

Figure 29:
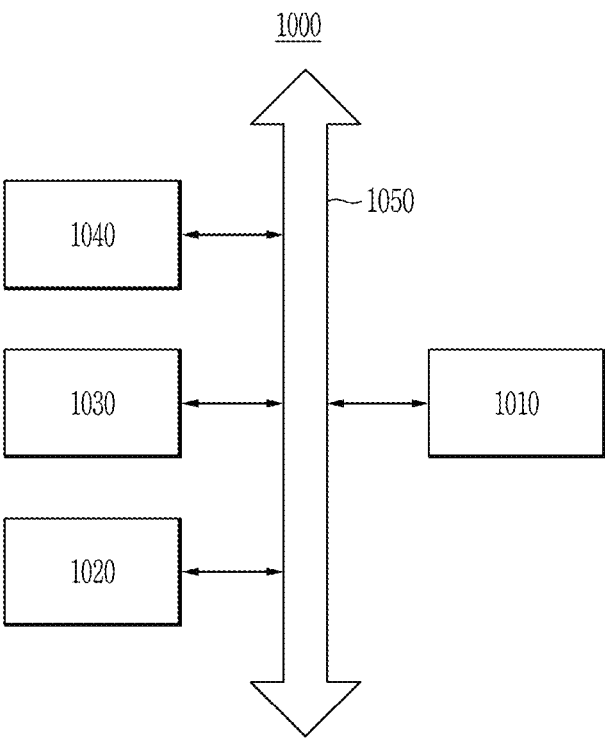
FIGS. 29 and 30 are diagrams schematically illustrating an electronic system and a memory card including a semiconductor device according to some example embodiments.

FIG. 29 is an electronic system 1000 including the semiconductor device according to some example embodiments.

The electronic system 1000 may include a controller 1010, an input/output device 1020, a memory device 1030, and an interface 1040. The electronic system 1000 may be a mobile system or a system that transmits or receives information. In some example embodiments, the mobile system may be a PDA, a portable computer, a web tablet, a wireless phone, a mobile phone, a digital music player, or a memory card. The controller 1010 is for controlling an execution program in the electronic system 1000, and may include a microprocessor, a digital signal processor, a microcontroller, or a device similar thereto. The input/output device 1020 may be used to input or output data of the electronic system 1000. The electronic system 1000 may be connected to an external device, for example, a personal computer or a network, by using the input/output device 1020, and may exchange data with an external device. The input/output device 1020 may be, for example, a keypad, a keyboard, or a display.

The memory device 1030 may store codes and/or data for an operation of the controller 1010 or store data processed by the controller 1010. The memory device 1030 includes a semiconductor device according to some example embodiments according to the technical concept of the present inventive concepts. For example, the memory device 1030 includes at least one semiconductor device among the semiconductor devices described with reference to FIGS. 1 to 26.

The interface 1040 may be a data transmission path between the electronic system 1000 and another external device. The controller 1010, the input/output device 1020, the memory device 1030, and the interface 1040 may communicate with each other via bus 1050. The electronic system 1000 may be used in a mobile phone, an MP3 player, a navigation device, a portable multimedia player (PMP), a solid state disk (SSD), or household appliances.

Figure 30:
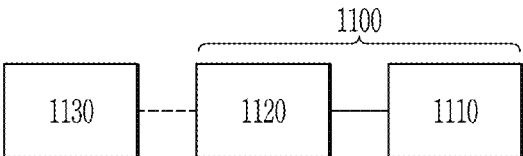

FIG. 30 is a diagram schematically illustrating a memory card 1100 including the semiconductor device according to the technical concept of the present inventive concepts.

The memory card 1100 may include a memory device 1110 and a memory controller 1120.

The memory device 1110 may store data. The memory controller 1120 may read data stored in the memory device 1110 or store data in the memory device 1110 in response to a read/write request from a host 1130.

The memory card 1100 includes the semiconductor devices according to some example embodiments according to the technical concept of the present inventive concepts. For example, the memory card 1100 includes at least one semiconductor device among the semiconductor devices described with reference to FIGS. 1 to 26.

As described herein, any devices, systems, units, circuits, controllers, processors, and/or portions thereof according to any of the example embodiments (including, for example, the semiconductor device 100, the memory cell array 110, the row decoder 120, the sense amplifier 130, the column decoder 140, the self-refresh control circuit 150, the command decoder 160, the Mode Register Set/Extended Mode Register Set (MRS/EMRS) circuit 170, the address buffer 180, the data input/output circuit 190, the memory core unit 132, the electronic system 1000, the controller 1010, the input/output device 1020, the memory device 1030, the interface 1040, the memory card 1100, the memory device 1110, the memory controller 1120, the host 1130, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, units, circuits, controllers, processors, and/or portions thereof according to any of the example embodiments.

In the above, the present inventive concepts have been described in detail with reference to some example embodiments, but the present inventive concepts are not limited to such example embodiments, and various modifications and changes are possible by those skilled in the art within the technical spirit and scope of the present inventive concepts.

What is claimed is:

1. A method of manufacturing a semiconductor device, the method comprising:

forming a first insulating layer in a cell array region of a substrate, the substrate including the cell array region and a core region;

etching the first insulating layer to form a plurality of storage element contact holes;

filling at least a portion of the plurality of storage element contact holes, forming a dummy mold layer over the core region and the cell array region, and planarizing the dummy mold layer to expose a top surface of the first insulating layer and form a dummy mold pattern in the plurality of storage element contact holes;

forming a contact plug hole in the core region; and forming a contact plug spacer on an inner wall of the contact plug hole.

2. The method of claim 1, wherein the forming of the dummy mold pattern includes planarizing the dummy mold layer so that a top surface of the core region and a top surface of the cell array region are positioned on a same level.

3. The method of claim 1, wherein a plurality of cell line structures is formed in the cell array region, and an insulating layer configured to form a fence is formed as the first insulating layer between the plurality of cell line structures.

4. The method of claim 3, further comprising:

forming a cell spacer covering the plurality of cell line structures prior to forming the dummy mold pattern, wherein the contact plug spacer is formed to be thicker than the cell spacer.

5. The method of claim 1, wherein a plurality of first conductive lines is formed in the cell array region, and an upper insulating layer is formed as the first insulating layer on the plurality of first conductive lines.

6. The method of claim 1, further comprising:

forming a plurality of core gate structures in the core region;

forming a buried insulating layer between the plurality of core gate structures; and forming a mask layer on the plurality of core gate structures and the buried insulating layer, wherein the contact plug hole is formed based on penetrating the mask layer and the buried insulating layer.

7. The method of claim 6, wherein:

the plurality of core gate structures includes a core gate electrode, a core gate capping pattern on the core gate electrode, and a core gate spacer on a sidewall of the core gate electrode and on a sidewall of the core gate capping pattern, and the contact plug hole is formed based on penetrating the mask layer and the buried insulating layer and partially passing through the core gate spacer.

*   *   *   *   *